(12) United States Patent
Stan et al.

(10) Patent No.: US 8,895,342 B2
(45) Date of Patent: Nov. 25, 2014

(54) HETEROJUNCTION SUBCELLS IN INVERTED METAMORPHIC MULTIJUNCTION SOLAR CELLS

(75) Inventors: Mark A. Stan, Albuquerque, NM (US); Arthur Cornfeld, Sandia Park, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 218 days.

(21) Appl. No.: 13/473,802

(22) Filed: May 17, 2012

(65) Prior Publication Data

US 2012/0227797 A1 Sep. 13, 2012

Related U.S. Application Data

(63) Continuation-in-part of application No. 12/023,772, filed on Jan. 31, 2008, now abandoned, which is a continuation-in-part of application No. 11/860,183, filed on Sep. 24, 2007, and a continuation-in-part of application No. 11/860,142, filed on Sep. 24, 2007, now abandoned.

(51) Int. Cl.
| | |
|---|---|
| *H01L 21/00* | (2006.01) |
| *G01R 31/26* | (2014.01) |
| *H01L 31/0693* | (2012.01) |
| *H01L 31/076* | (2012.01) |
| *H01L 31/18* | (2006.01) |
| *H01L 31/0687* | (2012.01) |

(52) U.S. Cl.
CPC ......... *H01L 31/06875* (2013.01); *Y02E 10/548* (2013.01); *Y02E 10/544* (2013.01); *H01L 31/0693* (2013.01); *H01L 31/076* (2013.01); *H01L 331/078* (2013.01); *H01L 31/1892* (2013.01)

USPC ............ 438/57; 438/74; 438/87; 438/98; 136/243; 136/255; 257/E21.002; 257/E21.215

(58) Field of Classification Search
None
See application file for complete search history.

(56) References Cited

U.S. PATENT DOCUMENTS

| 3,488,834 A | 1/1970 | Baird |
| 3,964,155 A | 6/1976 | Leinkram et al. |

(Continued)

FOREIGN PATENT DOCUMENTS

| EP | 1 109 230 A2 | 6/2001 |
| EP | 1 863 099 A2 | 12/2007 |

(Continued)

OTHER PUBLICATIONS

U.S. Appl. No. 12/265,113, filed Nov. 5, 2008, Varghese.

(Continued)

*Primary Examiner* — Mohsen Ahmadi

(57) ABSTRACT

Inverted metamorphic multijunction solar cells having a heterojunction middle subcell and a graded interlayer, and methods of making same, are disclosed herein. The present disclosure provides a method of manufacturing a solar cell using an MOCVD process, wherein the graded interlayer is composed of $(In_xGa_{1-x})_yAl_{1-y}As$, and is formed in the MOCVD reactor so that it is compositionally graded to lattice match the middle second subcell on one side and the lower third subcell on the other side, with the values for x and y computed and the composition of the graded interlayer determined so that as the layer is grown in the MOCVD reactor, the band gap of the graded interlayer remains constant at 1.5 eV throughout the thickness of the graded interlayer.

8 Claims, 23 Drawing Sheets

(56) References Cited

U.S. PATENT DOCUMENTS

| | | | |
|---|---|---|---|
| 4,001,864 A | 1/1977 | Gibbons | |
| 4,255,211 A | 3/1981 | Fraas | |
| 4,338,480 A | 7/1982 | Antypas et al. | |
| 4,393,576 A | 7/1983 | Dahlberg | |
| 4,598,164 A * | 7/1986 | Tiedje et al. | 136/249 |
| 4,612,408 A | 9/1986 | Moddel et al. | |
| 4,688,068 A * | 8/1987 | Chaffin et al. | 136/249 |
| 4,759,803 A | 7/1988 | Cohen | |
| 4,824,489 A | 4/1989 | Cogan et al. | |
| 4,859,627 A | 8/1989 | Sunakawa | |
| 4,881,979 A | 11/1989 | Lewis | |
| 4,963,949 A | 10/1990 | Wanlass et al. | |
| 5,009,720 A | 4/1991 | Hokuyo et al. | |
| 5,019,177 A | 5/1991 | Wanlass | |
| 5,021,360 A | 6/1991 | Melman et al. | |
| 5,053,083 A | 10/1991 | Sinton | |
| 5,217,539 A | 6/1993 | Fraas et al. | |
| 5,322,572 A | 6/1994 | Wanlass | |
| 5,342,453 A | 8/1994 | Olson | |
| 5,376,185 A | 12/1994 | Wanlass | |
| 5,405,453 A | 4/1995 | Ho et al. | |
| 5,479,032 A | 12/1995 | Forrest et al. | |
| 5,510,272 A | 4/1996 | Morikawa et al. | |
| 5,944,913 A | 8/1999 | Hou et al. | |
| 6,103,970 A | 8/2000 | Kilmer et al. | |
| 6,165,873 A | 12/2000 | Hamada | |
| 6,180,432 B1 | 1/2001 | Freeouf | |
| 6,239,354 B1 | 5/2001 | Wanlass | |
| 6,252,287 B1 | 6/2001 | Kurtz et al. | |
| 6,278,054 B1 | 8/2001 | Ho et al. | |
| 6,281,426 B1 | 8/2001 | Olson et al. | |
| 6,300,557 B1 | 10/2001 | Wanlass | |
| 6,300,558 B1 | 10/2001 | Takamoto et al. | |
| 6,316,716 B1 | 11/2001 | Hilgrath | |
| 6,326,540 B1 | 12/2001 | Kilmer et al. | |
| 6,340,788 B1 | 1/2002 | King et al. | |
| 6,359,210 B2 | 3/2002 | Ho et al. | |
| 6,372,980 B1 | 4/2002 | Freundlich | |
| 6,452,086 B1 | 9/2002 | Muller | |
| 6,482,672 B1 | 11/2002 | Hoffman et al. | |
| 6,600,100 B2 | 7/2003 | Ho et al. | |
| 6,660,928 B1 | 12/2003 | Patton et al. | |
| 6,680,432 B2 | 1/2004 | Sharps et al. | |
| 6,690,041 B2 | 2/2004 | Armstrong et al. | |
| 6,693,303 B2 | 2/2004 | Ota et al. | |
| 6,794,631 B2 | 9/2004 | Clark | |
| 6,815,736 B2 | 11/2004 | Mascarenhas | |
| 6,864,414 B2 | 3/2005 | Sharps et al. | |
| 6,951,819 B2 | 10/2005 | Iles et al. | |
| 7,071,407 B2 | 7/2006 | Faterni et al. | |
| 7,119,271 B2 | 10/2006 | King et al. | |
| 7,122,733 B2 | 10/2006 | Narayanan et al. | |
| 7,122,734 B2 | 10/2006 | Fetzer et al. | |
| 7,166,520 B1 | 1/2007 | Henley | |
| 7,339,109 B2 | 3/2008 | Stan et al. | |
| 7,696,429 B2 | 4/2010 | Strobl | |
| 7,727,795 B2 | 6/2010 | Stan et al. | |
| 7,741,146 B2 | 6/2010 | Cornfeld et al. | |
| 7,785,989 B2 | 8/2010 | Sharps et al. | |
| 7,812,249 B2 | 10/2010 | King et al. | |
| 7,842,881 B2 | 11/2010 | Cornfeld et al. | |
| 7,846,759 B2 | 12/2010 | Atwater, Jr. et al. | |
| 7,960,201 B2 | 6/2011 | Cornfeld et al. | |
| 8,039,291 B2 | 10/2011 | Cornfeld et al. | |
| 8,067,687 B2 | 11/2011 | Wanlass | |
| 8,187,907 B1 | 5/2012 | Newman | |
| 8,227,689 B2 | 7/2012 | King et al. | |
| 8,236,600 B2 | 8/2012 | Cornfeld | |
| 8,263,853 B2 | 9/2012 | Varghese | |
| 8,263,856 B2 | 9/2012 | Cornfeld et al. | |
| 8,378,281 B2 | 2/2013 | Kats et al. | |
| 2002/0164834 A1 | 11/2002 | Boutros et al. | |
| 2003/0070707 A1 | 4/2003 | King et al. | |
| 2004/0149331 A1 | 8/2004 | Sharps et al. | |
| 2005/0211291 A1 | 9/2005 | Bianchi | |
| 2006/0021565 A1 | 2/2006 | Zahler et al. | |
| 2006/0048700 A1 | 3/2006 | Wanlass et al. | |
| 2006/0162768 A1 | 7/2006 | Wanlass et al. | |
| 2006/0185582 A1 | 8/2006 | Atwater, Jr. et al. | |
| 2007/0137694 A1 | 6/2007 | Foster et al. | |
| 2007/0218649 A1 | 9/2007 | Hernandez | |
| 2007/0277873 A1 | 12/2007 | Cornfeld et al. | |
| 2008/0029151 A1 | 2/2008 | McGlynn et al. | |
| 2008/0149173 A1 | 6/2008 | Sharps | |
| 2008/0185038 A1 | 8/2008 | Sharps | |
| 2008/0245409 A1 | 10/2008 | Varghese et al. | |
| 2009/0038679 A1 | 2/2009 | Varhese et al. | |
| 2009/0078308 A1 | 3/2009 | Varghese et al. | |
| 2009/0078309 A1 | 3/2009 | Cornfeld et al. | |
| 2009/0078310 A1 | 3/2009 | Stan et al. | |
| 2009/0078311 A1 | 3/2009 | Stan et al. | |
| 2009/0155952 A1 | 6/2009 | Stan et al. | |
| 2009/0188546 A1 | 7/2009 | McGlynn et al. | |
| 2009/0223554 A1 | 9/2009 | Sharps | |
| 2009/0229658 A1 | 9/2009 | Stan et al. | |
| 2009/0229662 A1 | 9/2009 | Stan et al. | |
| 2009/0272430 A1 | 11/2009 | Cornfeld et al. | |
| 2009/0272438 A1 | 11/2009 | Cornfeld | |
| 2009/0288703 A1 | 11/2009 | Stan et al. | |
| 2009/0314348 A1 | 12/2009 | McGlynn et al. | |
| 2010/0012174 A1 | 1/2010 | Varghese et al. | |
| 2010/0012175 A1 | 1/2010 | Varghese et al. | |
| 2010/0047959 A1 | 2/2010 | Cornfeld et al. | |
| 2010/0093127 A1 | 4/2010 | Sharps et al. | |
| 2010/0122724 A1 | 5/2010 | Cornfeld et al. | |
| 2010/0122764 A1 | 5/2010 | Newman | |
| 2010/0147366 A1 | 6/2010 | Stan et al. | |
| 2010/0186804 A1 | 7/2010 | Cornfeld | |
| 2010/0203730 A1 | 8/2010 | Cornfeld et al. | |
| 2010/0206365 A1 | 8/2010 | Chumney et al. | |
| 2010/0229913 A1 | 9/2010 | Cornfeld | |
| 2010/0229926 A1 | 9/2010 | Newman et al. | |
| 2010/0229932 A1 | 9/2010 | Cornfeld et al. | |
| 2010/0229933 A1 | 9/2010 | Cornfeld | |
| 2010/0233838 A1 | 9/2010 | Varghese | |
| 2010/0236615 A1 | 9/2010 | Sharps | |
| 2010/0282288 A1 | 11/2010 | Cornfeld | |
| 2011/0041898 A1 | 2/2011 | Cornfeld | |
| 2012/0211047 A1 | 8/2012 | Cornfeld | |
| 2012/0211068 A1 | 8/2012 | Cornfeld et al. | |

FOREIGN PATENT DOCUMENTS

| | | |
|---|---|---|
| EP | 0 658 944 B1 | 4/2009 |
| FR | 2 878 076 A1 | 5/2006 |
| GB | 2 346 010 | 7/2000 |
| JP | 60-160181 A | 8/1985 |
| JP | 09-64397 A | 3/1997 |
| WO | WO 96/18213 | 6/1996 |
| WO | WO 99/62125 | 12/1999 |
| WO | WO 2005/015638 A1 | 2/2005 |
| WO | WO 2005/112131 A1 | 11/2005 |

OTHER PUBLICATIONS

U.S. Appl. No. 12/708,361, filed Feb. 18, 2010, Cornfeld.

U.S. Appl. No. 12/716,814, filed Mar. 3, 2010, Cornfeld.

U.S. Appl. No. 12/730,018, filed Mar. 23, 2010, Cornfeld.

U.S. Appl. No. 12/756,926, filed Apr. 8, 2010, Cornfeld.

U.S. Appl. No. 12/813,408, filed Jun. 10, 2010, Patel.

U.S. Appl. No. 12/844,673, filed Jul. 27, 2010, Stan.

Advisory Action mailed Mar. 15, 2011. U.S. Appl. No. 11/445,793; 46 pgs.

Aiken et al. "Consideration of High Bandgap Subcells for Advanced Multijunction Solar Cells," Conference Record of the 2006 IEEE 4th World Conference on Photovoltaic Energy Conversion. May 1, 2006, pp. 838-841.

Cornfeld, et al., "Development of a Large Area Inverted Metamorphic Multi-junction (IMM) Highly Efficient AM0 Solar Cell," 33rd IEEE Photovoltaic Specialists Conference, May 11-16, 2008, San Diego, CA, USA; 5 pgs.

(56) References Cited

OTHER PUBLICATIONS

Cornfeld, et al., "Development of a Large Area Inverted Metamorphic Multi-junction Highly Efficient AM0 Solar Cell," Conference paper presented at the 33$^{rd}$ IEEE Photovoltaic Specialists Conference (May 11-16, 2008) on May 12, 2008. San Diego, CA; 17 pages.

Cornfeld, et al., "Advances in the Performance of Inverted Metamorphic Multi-junction Solar Cells," 23$^{rd}$ European Photovoltaic Energy Conference, Sep. 1-5, 2008, Valencia, Spain; 11 pgs.

European Search Report for Application No. EP 08 01 3466. Dec. 18, 2009. European Patent Office, Berlin, Germany; 4 pgs.

Friedman, et al., "0.7-eV GaInAs Junction for a GaInP/GaAs/GaInAs(1eV)/GaInAs(0.7eV) Four-Junction Solar Cell," 2006 IEEE 4$^{th}$ World Conference on Photovoltaic Energy Conversion, May 7-12, 2006; 598-602. Waikoloa, HI, USA.

Geisz, et al., "High-efficiency GaInP/GaAs/InGaAs triple-junction solar cells grown inverted with a metamorphic bottom junction," *Applied Physics Letters*, 2007; 91(023502):023502-1-023502-3. Online publication Jul. 10, 2007. American Institute of Physics, Melville, NY.

Geisz, et al., "Inverted GaInP/(In)GaAs/InGaAs Triple-Junction Solar Cells with Low-Stress Metamorphic Bottom Junctions," 33$^{rd}$ IEEE Photovoltaic Specialists Conference, May 11-16, 2008, San Diego, CA, USA; 5 pgs.

Jun et al., "Bi surfactant control of ordering and surface structure in GaInP grown by organometallic vapor phase epitaxy," *Journal of Applied Physics*, 2000; 88: 4429-4433.

King, et al., "Next-Generation, High-Efficiency III-V Multijunction Solar Cells,"28$^{th}$ IEEE Photovoltaic Specialists Conference, Sep. 15-22, 2000, Anchorage, AK, USA.

King, et al., "High-Efficiency Space and Terrestrial Multijunction Solar Cells Through Bandgap Control in Cell Structures," 2002 Photovoltaic Specialists Conference, Conference Record of the 29$^{th}$ IEEE, May 19-24, 2002, New Orleans, LA, USA; pp. 776-781.

Newman et al., "Tellurium surfactant effects in the growth of lattice mismatched InAs$_x$P$_{1-x}$ by metal organic vapor-phase epitaxy," *Journal of Crystal Growth*, Dec. 2004; 272(1-4):650-657.

Office Action mailed Nov. 8, 2010 (double patenting rejection). U.S. Appl. No. 12/047,842.

Office Action mailed Nov. 9, 2010 (double patenting rejection). U.S. Appl. No. 11/860,142.

Office Action mailed Nov. 10, 2010 (double patenting rejection). U.S. Appl. No. 12/102,550.

Office Action mailed Jan. 4, 2011. U.S. Appl. No. 11/445,793. (Sexl reference, double patenting rejection).

Olego et al., "Compositional dependence of band-gap energy and conduction-band effective mass of In$_{1-x-y}$Ga$_x$Al$_y$As lattice matched to InP," *Applied Physics Letters*, Sep. 1, 1982; 41(5):476-478.

Pillai et al., "Growth of In$_x$Ga$_{1-x}$As/GaAs heterostructures using Bi as a surfactant," *Journal of Vacuum Science and Technology*, 2000; 18(3):1232-1236.

Romanov et al., "Threading dislocation reduction in strained layers," *Journal of Applied Physics*, Jan. 1, 1999; 85(1):182-192.

Schultz et al. "High Efficiency 1.0 eV GaInAs Bottom Solar Cell for 3-junction Monolithic Stack," Conference Record of the Twenty First IEEE Photovoltaic Specialists Conference May 21-25, 1990, Kissimmee, Florida. New York: The Institute of Electrical and Electronics Engineers, Inc., pp. 148-152.

Sexl et al., "MBE Growth of Metamorphic In(Ga)AlAs Buffers," 1997 IEEE International Symposium on Compound Semiconductors, Sep. 1997, pp. 49-52. IEEE, Piscataway, NJ.

Sharps, et al., "Inverting the triple junction improves efficiency and flexibility," *Compound Semiconductor*, Oct. 2007; 13(9):25-28. IOP Publishing, Ltd., Bristol, England.

Sinharoy, et al., "Progress in the Development of Metamorphic Multi junction III-V Space Solar Cells," *Progress in Photovoltaics: Research and Applications*, Feb. 2002; 10:427-432. John Wiley & Sons, Ltd. Hoboken, NJ.

Stan, et al., "Very High Efficiency Triple Junction Solar Cells by MOVPE," 14$^{th}$ International Conference of Metalorganic Vapor Phase Epitaxy, Jun. 1-6, 2008, Metz, France; 32 pgs.

Stan et al., "High-efficiency quadruple junction solar cells using OMVPE with inverted metamorphic device structures," *Journal of Crystal Growth*, 2010; 312:1370-1374. Elsevier, Amsterdam, Netherlands.

Takamoto, et al., "Future Development of InGaP/(In)GaAs Based Multijunction Solar Cells," Proceedings of the 31$^{st}$ IEEE PVSC, Jan. 3-7, 2005, Lake Buena Vista, FL; pp. 519-524.

Takamoto, et al., "InGaP/GaAs-based Multijunction Solar Cells," *Progress in Photovoltaics: Research and Applications*, 2005; 13:495-511.

Venkatasubramanian et al., "An Inverted-Growth Approach to Development of an IR-Transparent, High-Efficiency AlGaAs/GaAs Cascade Solar Cell," Research Triangle Institute, 1991; pp. 93-98, IEEE.

Venkatasubramanian, et al., "An Inverted-Growth Approach to Development of an IR-Transparent, High-Efficiency AlGaAs/GaAs Cascade Solar Cell," 22$^{nd}$ IEEE Photovoltaic Specialists Conference, Oct. 7-11, 1991, Las Vegas, NV; pp. 93-98.

Venkatasubramanian, et al., "High-quality eutectic-metal-bonded AlGaAs-GaAs thin films on Si Substrates," *Applied Physics Letters*, Feb. 17, 1992; 60(7):886-888.

Wanlass et al., "Lattice-Mismatched Approaches for High-Performance, III-V Photovoltaic Energy Converters," Conference Record of the 31$^{st}$ IEEE PVSC, Jan. 3, 2005; pp. 530-535. Piscataway, NJ, USA.

Wanlass et al., "Monolithic, Ultra-Thin GaInP/GaAs/GaInAs Tandem Solar Cells,"2006 IEEE 4$^{th}$ World Conference on Photovoltaic Energy Conversion, May 7-12, 2006, Waikoloa, HI; 729-732.

Wurfel, *Physics of Solar Cells: from Basic Principles to Advanced Concepts*, 2$^{nd}$ Updated and Expanded Edition, 2009. Sections 6.4, 6.5 and 6.8. 20 pages. Wiley-VCH, Weinheim, Germany.

Yamaguchi, "Physics and Technologies of Superhigh-Effficiency Tandem Solar Cells," *Semiconductors*, Sep. 1999; 33(9): 961-964. Toyota Technological Institute, Nagoya, Japan. © 1999, American Institute of Physics.

Yastrubchak et al., "Misfit dislocations and surface morphology of lattice-mismatched GaAs/InGaAs heterostructures," *Physica E*, Apr. 2003; 17:561-563.

Yoon, et al., "Progress of Inverted Metamorphic III-V Solar Cell Development at Spectrolab," 33$^{rd}$ IEEE Photovoltaic Specialists Conference, May 11-16, 2008, San Diego, CA, USA; 6 pgs.

Lewis et al., "The Crystallographic Connection of MOCVD-Grown Monolithic Cascade Subcells Via Transparent Graded Layers," *Journal of Crystal Growth*, 1984; 69:515-526.

Lewis et al., "Recent Developments in Multijunction Solar Cell Research," *Solar Cells*, 1988; 24:171-183.

\* cited by examiner

HETEROJUNCTION SUBCELLS IN INVERTED METAMORPHIC MULTIJUNCTION SOLAR CELLS

This application is a continuation-in-part of application Ser. No. 12/023,772, filed Jan. 31, 2008, which is a continuation-in-part of application Ser. No. 11/860,142, filed Sep. 24, 2007, and a continuation-in-part of application Ser. No. 11/860,183, filed Sep. 24, 2007, all of which are incorporated herein by reference in their entireties.

REFERENCE TO RELATED APPLICATIONS

This application is related to co-pending U.S. patent application Ser. No. 13/440,331 filed Apr. 15, 2012.

This application is related to co-pending U.S. patent application Ser. No. 13/401,181 filed Feb. 21, 2012.

This application is related to co-pending U.S. patent application Ser. No. 12/844,673 filed Jul. 27, 2010.

This application is related to co-pending U.S. patent application Ser. No. 12/813,408 filed Jun. 10, 2010.

This application is related to co-pending U.S. patent application Ser. No. 12/775,946 filed May 7, 2010.

This application is related to co-pending U.S. patent application Ser. No. 12/756,926, filed Apr. 8, 2010.

This application is related to co-pending U.S. patent application Ser. No. 12/730,018, filed Mar. 23, 2010.

This application is related to co-pending U.S. patent application Ser. No. 12/716,814, filed Mar. 3, 2010.

This application is related to co-pending U.S. patent application Ser. No. 12/708,361, filed Feb. 18, 2010.

This application is related to co-pending U.S. patent application Ser. No. 12/637,241, filed Dec. 14, 2009.

This application is related to co-pending U.S. patent application Ser. No. 12/623,134, filed Nov. 20, 2009.

This application is related to co-pending U.S. patent application Ser. No. 12/544,001, filed Aug. 19, 2009.

This application is related to co-pending U.S. patent application Ser. Nos. 12/401,137, 12/401,157, and 12/401,189, filed Mar. 10, 2009.

This application is related to co-pending U.S. patent application Ser. No. 12/362,201, now U.S. Pat. No. 7,960,201; Ser. No. 12/362,213; and Ser. No. 12/362,225, filed Jan. 29, 2009.

This application is related to co-pending U.S. patent application Ser. No. 12/337,014 filed Dec. 17, 2008, now U.S. Pat. No. 7,785,989, and Ser. No. 12/337,043 filed Dec. 17, 2008.

This application is related to co-pending U.S. patent application Ser. No. 12/271,127 and Ser. No. 12/271,192 filed Nov. 14, 2008.

This application is related to co-pending U.S. patent application Ser. No. 12/267,812 filed Nov. 10, 2008.

This application is related to co-pending U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to co-pending U.S. patent application Ser. No. 12/187,477, filed Aug. 7, 2008.

This application is related to co-pending U.S. patent application Ser. No. 12/218,558 and U.S. patent application Ser. No. 12/218,582 filed Jul. 16, 2008.

This application is related to co-pending U.S. patent application Ser. No. 12/123,864 filed May 20, 2008.

This application is related to co-pending U.S. patent application Ser. No. 12/023,772, filed Jan. 31, 2008.

This application is related to U.S. patent application Ser. No. 11/956,069, filed Dec. 13, 2007, and its divisional application Ser. No. 12/187,454 filed Aug. 7, 2008, now U.S. Pat. No. 7,727,795.

This application is also related to co-pending U.S. patent application Ser. Nos. 11/860,142 and 11/860,183 filed Sep. 24, 2007.

This application is also related to co-pending U.S. patent application Ser. No. 11/445,793 filed Jun. 2, 2006.

This application is also related to co-pending U.S. patent application Ser. No. 11/500,053 filed Aug. 7, 2006, and its divisional application Ser. No. 12/417,367 filed Apr. 2, 2009.

GOVERNMENT RIGHTS STATEMENT

This invention was made with government support under Contract No. FA9453-06-C-0345 awarded by the U.S. Air Force. The Government has certain rights in the invention.

BACKGROUND OF THE INVENTION

1. Field of the Invention

The present invention relates to the field of solar cell semiconductor devices, and particularly to multijunction solar cells including a metamorphic layer. Such devices also include solar cells known as inverted metamorphic multijunction solar cells.

2. Description of the Related Art

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as concentrator terrestrial power systems and satellites used in data communications have dramatically increased the demand for solar cells with improved power and energy conversion characteristics.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often fabricated in vertical, multijunction structures, and disposed in horizontal arrays, with the individual solar cells connected together in a series. The shape and structure of an array, as well as the number of cells it contains, are determined in part by the desired output voltage and current.

Inverted metamorphic solar cell structures such as described in M. W. Wanless et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005) present an important conceptual starting point for the development of future commercial high efficiency solar cells. The structures described in such reference present a number of practical difficulties relating to the appropriate choice of materials and fabrication steps.

Prior to the present invention, the materials and fabrication steps disclosed in the prior art have not been adequate to produce a commercially viable and energy efficient solar cell using an inverted metamorphic multijunction cell structure.

SUMMARY OF THE INVENTION

In one aspect, the present disclosure provides a method of forming a multijunction solar cell that includes: forming a bottom subcell having a bandgap in the range of 0.8 to 1.2 eV; forming a heterojunction middle subcell having a base and emitter, a bandgap greater than the bandgap of the bottom subcell and less than 1.50 eV, and being disposed over and being lattice mismatched to the bottom subcell; selecting a bandgap for an interlayer and forming a continuously-graded interlayer, wherein the bandgap that remains constant at about 1.50 eV between the middle and bottom subcells; and forming a homojunction top subcell having a base and emitter and being disposed over and being lattice matched to the middle subcell, wherein said graded interlayer is compositionally graded to lattice match the middle subcell at one side and the bottom subcell at an opposing side. In some embodiments forming the graded interlayer includes: picking an interlayer composed of InGaAlAs; identifying (e.g., by using a computer program) a set of compositions of the formula $(In_xGa_{1-x})_yAl_{1-y}As$ defined by specific values of x and y, wherein 0<x<1 and 0<y<1, each composition having a bandgap of 1.50 eV; identifying a lattice constant for one side of the graded interlayer that matches the middle subcell and a lattice constant for an opposing side of the interlayer that matches the bottom subcell; and identifying (e.g., by using a computer program) a subset of compositions of the formula $(In_xGa_{1-x})_yAl_{1-y}As$ having bandgaps of 1.5 eV that are defined by specific values of x and y, wherein 0<x<1 and 0<y<1, wherein the subset of compositions have lattice constants ranging from the identified lattice constant that matches the middle subcell to the identified lattice constant that matches the bottom subcell. In some embodiments, the method further includes precisely controlling and incrementally adjusting the mole fraction of each of In, Ga, and Al to form the continuously-graded interlayer.

In another aspect, the present disclosure provides a method of forming a multijunction solar cell that includes: forming a bottom subcell having a bandgap in the range of 0.8 to 1.2 eV; forming a heterojunction middle subcell having a base and emitter, a bandgap greater than the bandgap of the bottom subcell and less than 1.50 eV, and being disposed over and being lattice mismatched to the bottom subcell; selecting a bandgap for an interlayer and forming a step-graded interlayer, wherein the bandgap that remains constant at about 1.50 eV between the middle and bottom subcells; and forming a homojunction top subcell having a base and emitter and being disposed over and being lattice matched to the middle subcell, wherein said graded interlayer is compositionally graded to lattice match the middle subcell at one side and the bottom subcell at an opposing side. In some embodiments, forming the graded interlayer includes: picking an interlayer including a plurality of sublayers composed of InGaAlAs; identifying (e.g., by using a computer program) a set of compositions of the formula defined by specific values of x and y, wherein 0<x<1 and 0<y<1, each composition having a bandgap of 1.50 eV; identifying a lattice constant for one side of the graded interlayer that matches the middle subcell and a lattice constant for an opposing side of the interlayer that matches the bottom subcell; identifying (e.g., by using a computer program) a subset of compositions of the formula $(In_xGa_{1-x})_yAl_{1-y}As$ having bandgaps of 1.5 eV that are defined by specific values of x and y, wherein 0<x<1 and 0<y<1, wherein the subset of compositions have lattice constants ranging from the identified lattice constant that matches the middle subcell to the identified lattice constant that matches the bottom subcell; and selecting a composition for each sublayer of the plurality of sublayers from the subset of compositions. In some embodiments the method further includes precisely controlling and step-wise adjusting the mole fraction of each of In, Ga, and Al to form the step-graded interlayer.

In some embodiments, forming the graded interlayer can further include: providing a metal organic chemical vapor deposition (MOCVD) system configured to independently control the flow of source gases for gallium (e.g., trimethylgallium; $GaMe_3$), indium (e.g., trimethylindium; $InMe_3$), aluminum (e.g., trimethylaluminium; $Al_2Me_6$), and arsenic (e.g., arsine; $AsH_3$); selecting a reaction time and temperature and a flow rate for each source gas to form the graded interlayer disposed on the bottom subcell.

In another aspect, the present disclosure provides a multijunction solar cell that includes: a bottom subcell having a bandgap in the range of 0.8 to 1.2 eV; a middle subcell having a base and an emitter, a bandgap greater than the bandgap of the bottom subcell and less than 1.5 eV, and being disposed over and being lattice mismatched to the bottom subcell, the base and the emitter of the middle subcell forming a heterojunction; a top subcell having a base and emitter, and being disposed over and being lattice matched to the middle subcell, the base and the emitter of the top subcell forming a homojunction; and a graded interlayer (e.g., continuously-graded or step-graded) having a bandgap that remains constant at about 1.50 eV and a composition defined by the formula $(In_xGa_{1-x})_yAl_{1-y}As$, where 0<x<1 and 0<y<1, with the values for x and y selected such that the compositionally graded interlayer has a bandgap of 1.50 eV, and lattice matches the middle subcell at one side and the bottom subcell at an opposing side. In some embodiments, the middle subcell is composed of a GaInP, GaAs, GaInAs, GaAsSb, or GaInAsN emitter region and a GaAs, GaInAs, GaAsSb, or GaInAsN base region. In certain embodiments, the middle subcell is composed of an InGaP emitter layer and a GaAs or an $In_{0.015}GaAs$ base layer. In some embodiments the bottom subcell is composed of InGaAs base and emitter regions.

In some embodiments, the band gap of the graded interlayer remains constant at 1.5 eV throughout the thickness of the graded interlayer. More specifically, in some embodiments, the present disclosure provides a method of manufacturing a solar cell using an MOCVD process, wherein the graded interlayer is composed of $(In_xGa_{1-x})_yAl_{1-y}As$, and is formed in the MOCVD reactor so that it is compositionally graded to lattice match the middle second subcell on one side and the lower third subcell on the other side, with the values for x and y computed and the composition of the graded interlayer determined so that as the layer is grown in the MOCVD reactor, the band gap of the graded interlayer remains constant at 1.5 eV throughout the thickness of the graded interlayer.

BRIEF DESCRIPTION OF THE DRAWING

The invention will be better and more fully appreciated by reference to the following detailed description when considered in conjunction with the accompanying drawings, wherein.

DESCRIPTION OF THE PREFERRED EMBODIMENTS

Figure 1:
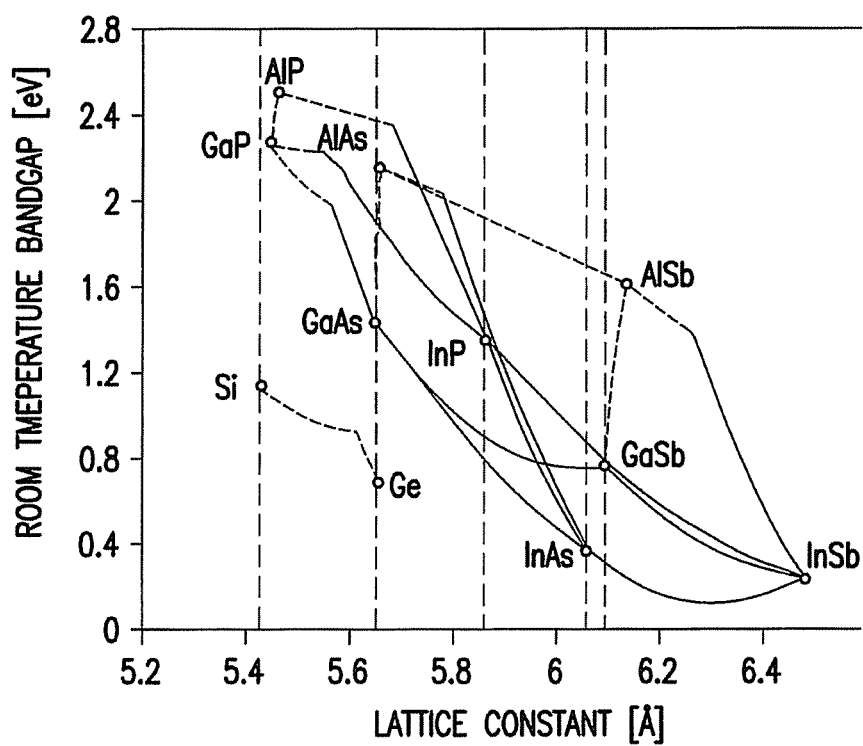
FIG. 1 is a graph representing the bandgap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high bandgap subcells (i.e. subcells with bandgaps in the range of 1.8 to 2.1 eV), which would normally be the "top" subcells facing the solar radiation, are grown epitaxially on a semiconductor growth substrate, such as for example GaAs or Ge, and such subcells are therefore lattice-matched to such substrate. One or more lower bandgap middle subcells (i.e. with bandgaps in the range of 1.2 to 1.6 eV) can then be grown on the high bandgap subcells.

At least one lower subcell is formed over the middle subcell such that the at least one lower subcell is substantially lattice-mismatched with respect to the growth substrate and such that the at least one lower subcell has a third lower bandgap (i.e. a bandgap in the range of 0.8 to 1.2 eV). A surrogate substrate or support structure is provided over the "bottom" or substantially lattice-mismatched lower subcell, and the growth semiconductor substrate is subsequently removed. (The growth substrate may then subsequently be re-used for the growth of a second and subsequent solar cells).

The present application is generally directed to an inverted metamorphic multijunction solar cell, and its method of fabrication, that incorporates one or more heterojunctions. As noted in related U.S. Pat. No. 7,071,407 of Fatemi et al., assigned to the co-assignee hereof, it is critical to have semiconductor materials having both lattice matching and optimal band gaps to enhance solar cell performance. In one embodiment of the present invention, a higher band gap heterojunction middle subcell is used to increase the photocurrent generated and the coverage of the solar spectrum.

Replacing a conventional homojunction middle subcell with a high band gap heterojunction middle subcell also has benefits in addition to increasing the light generated photocurrent. As noted in related U.S. Pat. No. 7,071,407 of Fatemi et al, a high band gap heterojunction decreases the dark saturated current, i.e. thermally generated charge carriers formed under zero illumination.

The open circuit voltage ($V_{oc}$) is determined the relationship:

$$V_{oc} = (nkT/q)\ln((J_{sc}/J_{sat})+1)$$

where k is the Boltzman constant, T is the temperature, q is the electronic charge, $J_{sc}$ is the short circuit current density, n is the diode ideality factor, and $J_{sat}$ is the saturation current density of the diode. In other words, using a high band gap heterojunction middle subcell reduces dark saturated current and consequently, provides a larger open circuit voltage ($V_{oc}$).

A triple junction solar cell structure having a high band gap heterojunction middle subcell provides higher open circuit voltage and higher short circuit current. In other words, the sunlight or photogenerated photocurrent increases by utilizing a higher band gap emitter heterojunction, since the amount of photons that can be absorbed in the emitter region is relatively low compared to the absorption in the base region. Thus, another advantage of using a heterojunction middle subcell is that the emitter with high band gap semiconductor material is more efficient to pass the sub-band-gap sunlight to the base region. Accordingly, a high band gap heterojunction middle subcell provides a larger short circuit current since it offers higher average collection probability of photogenerated carriers.

FIG. 1 is a graph representing the bandgap of certain binary materials and their lattice constants. The bandgap and lattice constants of ternary materials are located on the solid lines drawn between typical associated binary materials (such as GaAlAs being between the GaAs and AlAs points on the graph, with the bandgap varying between 1.42 eV for GaAs and 2.16 eV for AlAs). Thus, depending upon the desired bandgap, the material constituents of a ternary material can be appropriately selected for growth.

The lattice constants and electrical properties of the layers in the semiconductor structure are preferably controlled by specification of appropriate reactor growth temperatures and times, and by use of appropriate composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

The present disclosure is directed to a growth process using a metal organic chemical vapor deposition (MOCVD) process in a standard, commercially available reactor suitable for high volume production. More particularly, the present disclosure is directed to the materials and fabrication steps that are particularly suitable for producing commercially viable inverted metamorphic multijunction solar cells using commercially available equipment and established high-volume fabrication processes, as contrasted with merely academic expositions of laboratory or experimental results.

Figure 2:
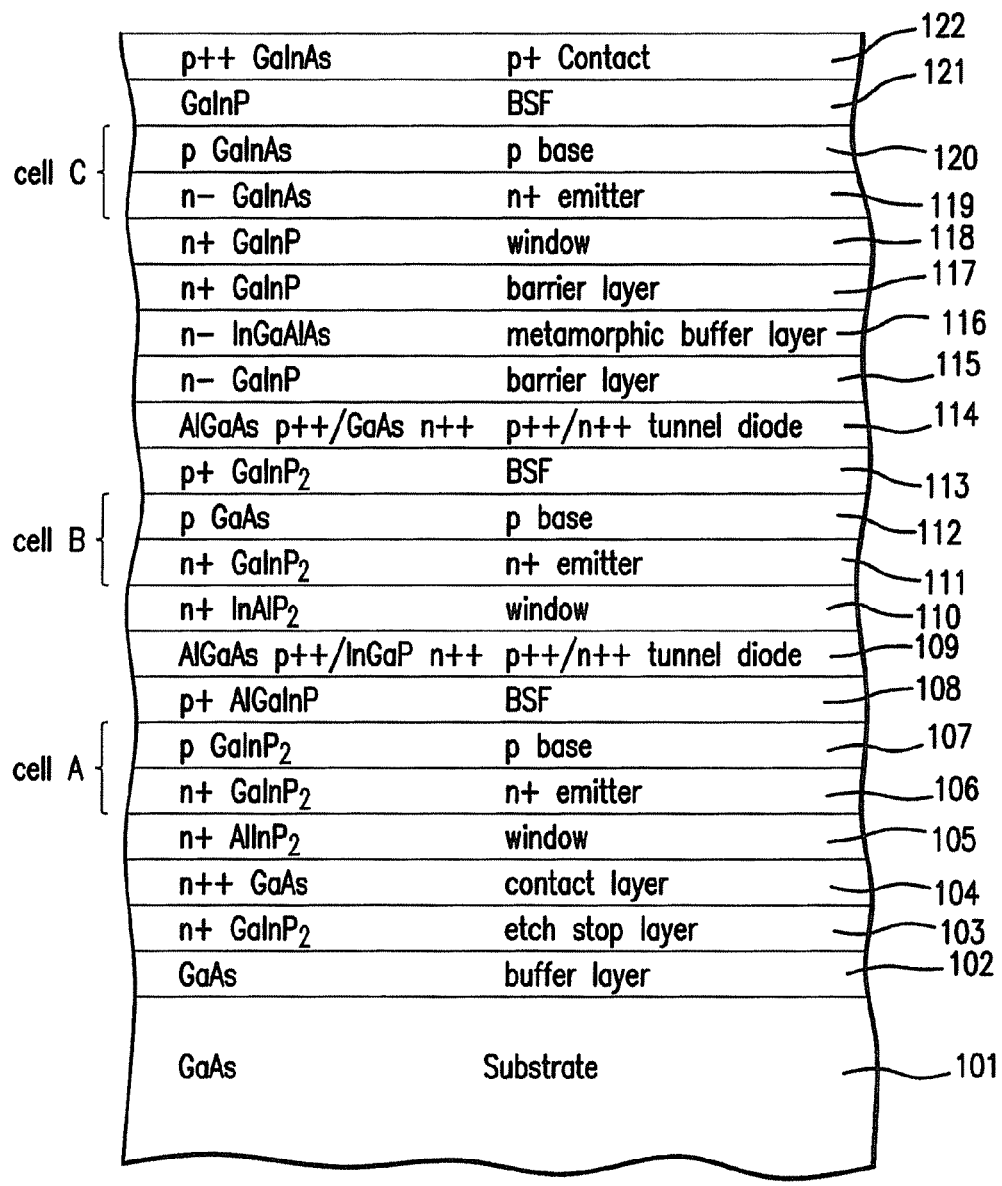
FIG. 2 is a cross-sectional view of the solar cell of the invention after the deposition of semiconductor layers on the growth substrate.

FIG. 2 depicts the inverted metamorphic multijunction (IMM) solar cell structure according to the present invention after epitaxial growth of the three subcells A, B and C on a substrate. Earlier embodiments of IMM solar cell structure described in the related patent applications noted above incorporated homo-junction subcells, i.e. emitter/base layers consisting of a n-InGaP/p-InGaP top cell, a n-GaAs/p-GaAs middle cell, and an n-InGaAs/p-InGaAs bottom cell. The analysis of internal quantum efficiency and $V_{oc}$ data measurements made on such solar cells indicate that such subcells can benefit from an improvement in blue response and reduction in dark current.

Degradation in the blue response of a solar cell is associated with recombination current in the emitter and at the window/emitter interface. If the emitter band-gaps of the subcells below the top subcell, that is, the middle and bottom subcell emitter bandgaps, are greater than or equal to the top cell bandgap, then no radiation will be present to be absorbed in the emitters. All radiation impinging on the lower bandgap subcells will be absorbed in the lower doped, better-collecting base regions, thereby, maximizing the blue responses. In addition, recombination currents generated by optical absorption will be absent from the lower subcell emitters and emitter/window regions. Granted, the improvements in current collection and increased $V_{oc}$ values may be small but they are significant in optimizing cell performance.

The problem is to maximize the short circuit current density ($J_{sc}$) and open circuit voltage ($V_{oc}$) from each subcell. Optically generated recombination currents in the emitter and at the window/emitter interface negatively impact both $J_{sc}$ and $V_{oc}$. This problem is often addressed by (1) growing a very low defect window/emitter interface with large valance bandgap off-set, and (2) incorporating a drift field in the emitter to drive the minority carriers to the junction. The present invention eliminates the optical properties of the window/emitter interface and emitter from the subcell performance, since substantially all optically generated minority carriers are created in the base regions.

Turning to the solar cell structure depicted in FIG. 2, there is shown a substrate 101, which may be either gallium arsenide (GaAs), germanium (Ge), or other suitable material. In the case of a Ge substrate, a nucleation layer (not shown) is deposited directly on the substrate. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 16.

Subcell A will ultimately become the "top" subcell of the inverted metamorphic structure after completion of the process steps according to the present invention to be described hereinafter.

On top of the base layer 107a back surface field ("BSF") layer 108 is deposited and used to reduce recombination loss, preferably p+ AlGaInP.

The BSF layer 108 drives minority carriers from the region near the base/BSF interface surface to minimize the effect of recombination loss. In other words, a BSF layer 108 reduces recombination loss at the backside of the solar subcell A and thereby reduces the recombination in the base.

On top of the BSF layer 108 is deposited a sequence of heavily doped p-type and n-type layers 109 which forms a tunnel diode which is a circuit element to connect subcell A to subcell B. These layers are preferably composed of p++ AlGaAs, and n++ InGaP.

On top of the tunnel diode layers 109a window layer 110 is deposited, preferably n+ InAlP. The window layer 110 used in the subcell B also operates to reduce the recombination loss. The window layer 110 also improves the passivation of the cell surface of the underlying junctions. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}$GaAs respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 16.

In the preferred embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the middle subcell B nor the bottom subcell C emitters will be exposed to absorbable radiation. Substantially radiation will be absorbed in the bases of cells B and C, which have narrower band gaps then the emitters. Therefore, the advantages of using heterojunction subcells are: 1) the short wavelength response for both subcells will improve, and 2) the recombination currents at the emitter/window interface and in the emitter will decrease. These results will increase $J_{sc}$ and $V_{oc}$.

On top of the cell B is deposited a BSF layer 113 which performs the same function as the BSF layer 109. A p++/n++ tunnel diode 114 is deposited over the BSF layer 113 similar to the layers 109, again forming a circuit element to connect subcell B to subcell C. These layers 114 are preferably composed of p++ AlGaAs and n++ InGaP.

A barrier layer 115, preferably composed of n-type InGa (Al)P, is deposited over the tunnel diode 114, to a thickness of about 1.0 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The bandgap of layer 116 is constant throughout its thickness preferably approximately 1.5 eV or otherwise consistent with a value slightly greater than the bandgap of the middle subcell B. The preferred embodiment of the graded interlayer may also be expressed as being composed of $(In_xGa_{1-x})_yAl_{1-y}As$, with x and y selected such that the band gap of the interlayer remains constant at approximately 1.50 eV.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the interlayer would remain constant at 1.9 eV.

In the inverted metamorphic structure described in the Wanless et al. paper cited above, the metamorphic layer consists of nine compositionally graded InGaP steps, with each step layer having a thickness of 0.25 micron. As a result, each layer of Wanless has a different bandgap. In the preferred embodiment of the present invention, the layer 116 is composed of a plurality of layers of InGaAlAs, with monotonically changing lattice constant, each layer having the same bandgap, approximately 1.5 eV.

The advantage of utilizing a constant bandgap material such as InGaAlAs is that arsenide-based semiconductor material is much easier to process from a manufacturing standpoint in standard commercial MOCVD reactors than materials incorporating phosphorus, while the small amount of aluminum in the bandgap material assures radiation transparency of the metamorphic layers.

Since the present disclosure (and the related applications noted above) are directed to high volume manufacturing processes using metalorganic vapor phase epitaxy (MOVPE) reactors to form the solar cell epitaxial layers, a short discussion of some of the considerations associated with such processes and methods associated with the formation of the graded interlayer(s) are in order here.

First, it should be noted that the advantage of utilizing an interlayer material such as AlGaInAs is that arsenide-based semiconductor material is much easier to process from a manufacturing standpoint using present state-of-the-art high volume manufacturing metalorganic vapor phase epitaxy (MOVPE) reactors than either the AlGaInAsP, or GaInP compounds, or in general any material including phosphorus. Simply stated, the use of a III-V arsenide compound is much more desirable than a III-V phosphide compound from the perspectives of cost, ease of growth, reactor maintenance, waste handling and personal safety.

The cost advantage of the use of the AlGaInAs quaternary grading material relative to a GaInP ternary grading material, as an example, is a consequence of several factors. First, the use of a GaInP grading approach requires indium mole fractions of the order of 60% (i.e., the required material is $Ga_{0.4}In_{0.6}P$) whereas the use of the AlGaInAs quaternary requires only 15% indium (i.e., the required material is $Al_y(Ga_{0.85}In_{0.15})_{1-y}As$). In addition to the difference in the material itself, there is a further difference in the amount of precursor gases (trimethylgallium, trimethylindium, and arsine) that must be input to the reactor in order to achieve the desired composition. In particular, the ratio of the amount of precursor gases into the reactor to provide Group V elements, to the amount of precursor gases to provide Group III elements (such ratio being referred to as the "input V/III ratio") is typically five to ten times greater to produce a phosphide compound compared to producing an arsenide compound. As a illustrative quantification of the cost of producing a phosphide compound in a commercial operational MOPVE reactor process compared to the cost of producing an arsenide compound, Table 1 below presents the typical pro-formula costs of each element of the AlGaInAs and GaInP compounds for producing a graded interlayer of the type described in the present disclosure expressed on a per mole basis. Of course, like many commodities, the price of chemical compounds fluctuate from time to time and vary in different geographic locations and countries and from supplier to supplier. The prices used in Table 1 are representative for purchases in commercial quantities in the United States at the time of the present disclosure. The cost calculations make the assumption (typical for epitaxial processes using current commercial MOVPE reactors) that the input V/III ratios are 20 and 120 for the arsenide and phosphide compounds respectively. Such a choice of value of the ratio is merely illustrative for a typical process, and some processes may use even higher ratios for producing a graded interlayer of the type described in the present disclosure. The practical consequence of the inlet V/III ratio is that one will use 20 moles of As to one (1) mole of AlGaIn in the formation of the Applicant's quaternary material AlGaInAs, or 120 moles of P to 1 mole of Gain in the formation of the interlayer using the ternary material GaInP. These assumptions along with the molar cost of each of the constituent elements indicate that the cost of fabrication of the AlGaInAs based grading interlayer will be approximately 25% of the cost of fabrication of a similar phosphide based grading interlayer. Thus, there is an important economic incentive from a commercial and manufacturing perspective to utilize an arsenide compound as opposed to a phosphide compound for the grading interlayer.

TABLE 1

Cost estimate of one mole of each of the AlGaInAs and GaInP grading layers.

| Element | MW (gms) | $/gm | Cost/mole ($) | MF AlGaIn | Cost Molecular Mole of Al.17Ga.68In.15 | MF GaInP | Cost Molecular Mole of Ga.4In.6 |
|---|---|---|---|---|---|---|---|
| Al | 27 | 10.2 | 275.4 | 0.17 | 46.818 | 0 | 0 |
| Ga | 70 | 2.68 | 187.6 | 0.68 | 127.568 | 0.4 | 75.04 |
| In | 115 | 28.05 | 3225.75 | 0.15 | 483.8625 | 0.6 | 1935.45 |
| | | | | Approx OM Cost/mole = | 658.2485 | | 2010.49 |

| | Cost/mole ($) | V/III ratio | | | Cost/mole of Arsenic | | Cost/mole of phosphorus |
|---|---|---|---|---|---|---|---|
| AsH3 | $7.56 | 20 | $151.20 | | $151.20 | | |
| PH3 | $9.49 | 120 | $1,138.80 | | | | $1,138.54 |
| | | | | Approx cost/molecular mole = | $809.45 | | $3,149.03 |

The "ease of growth" of an arsenide compound as opposed to a phosphide compound for the grading interlayer in a high volume manufacturing environment is another important consideration and is closely related to issues of reactor maintenance, waste handling and personal safety. More particularly, in a high volume manufacturing environment the abatement differences between arsenide and phosphide based processes affect both cost and safety. The abatement of phosphorus is more time consuming, and hazardous than that required for arsenic. Each of these compounds builds up over time in the downstream gas flow portions of the MOVPE growth reactor. As such, periodic reactor maintenance for removal of these deposited materials is necessary to prevent adverse affects on the reactor flow dynamics, and thus the repeatability and uniformity of the epitaxial structures grown in the reactor. The difference in handling of these waste materials is significant. Arsenic as a compound is stable in air, non-flammable, and only represents a mild irritant upon skin contact. Phosphorus however, must be handled with considerably more care. Phosphorus is very flammable and produces toxic fumes upon burning and it is only moderately stable in air. Essentially the differences are manifest by the need for special handling and containment materials and procedures when handling phosphorus to prevent either combustion or toxic exposure to this material whereas using common personal protection equipment such as gloves, and a particle respirator easily accommodates the handling of arsenic.

Another consideration related to "ease of growth" that should be noted in connection with the advantages of a AlGaInAs based grading interlayer process compared to a AlGaInAsP compound derives from a frequently encountered issue when using an AlGaInAsP compound: the miscibility gap. A miscibility gap will occur if the enthalpy of mixing exceeds the entropy of mixing of two binary compounds AC and BC, where A, B and C are different elements. It is an established fact that the enthalpies of mixing of all ternary crystalline alloys of the form $A_xB_{1-x}C$, based upon the binary semiconductor forms AC and BC are positive leading to miscibility gaps in these compounds. See, for example, the discussion in Elyukhin et al., *J. Crystal Growth* 1997, 173: 69-72. In this example, the letters A and B designate group III elements and letter C designates a group V element. As such, mixing of the binary compounds is said to occur on the group III sublattice. However, because OMVPE growth takes place under non-equilibrium conditions, the miscibility gap is not really a practical problem for accessing the entire ternary III-V semiconductor phase space. For the case of quaternary compounds of the form $A_xB_{1-x}C_yD_{1-y}$ where mixing of the binary alloys, AC, AD, BC, and BD occurs on both the group III and group V sublattices, the immiscibility problem is accentuated. Specifically for the GaP, InP, GaAs, InAs system, the region of immiscibility is quite large at growth temperatures appropriate for the OMVPE technique. See, for example, the discussion in Stringfellow, *Organometallic Vapor-Phase Epitaxy* (Academic Press, New York 1989). The resulting miscibility gap will prevent one from producing the requisite AlGaInAsP compounds needed for optical transparent grading of the IMM solar cell.

Figure 18:
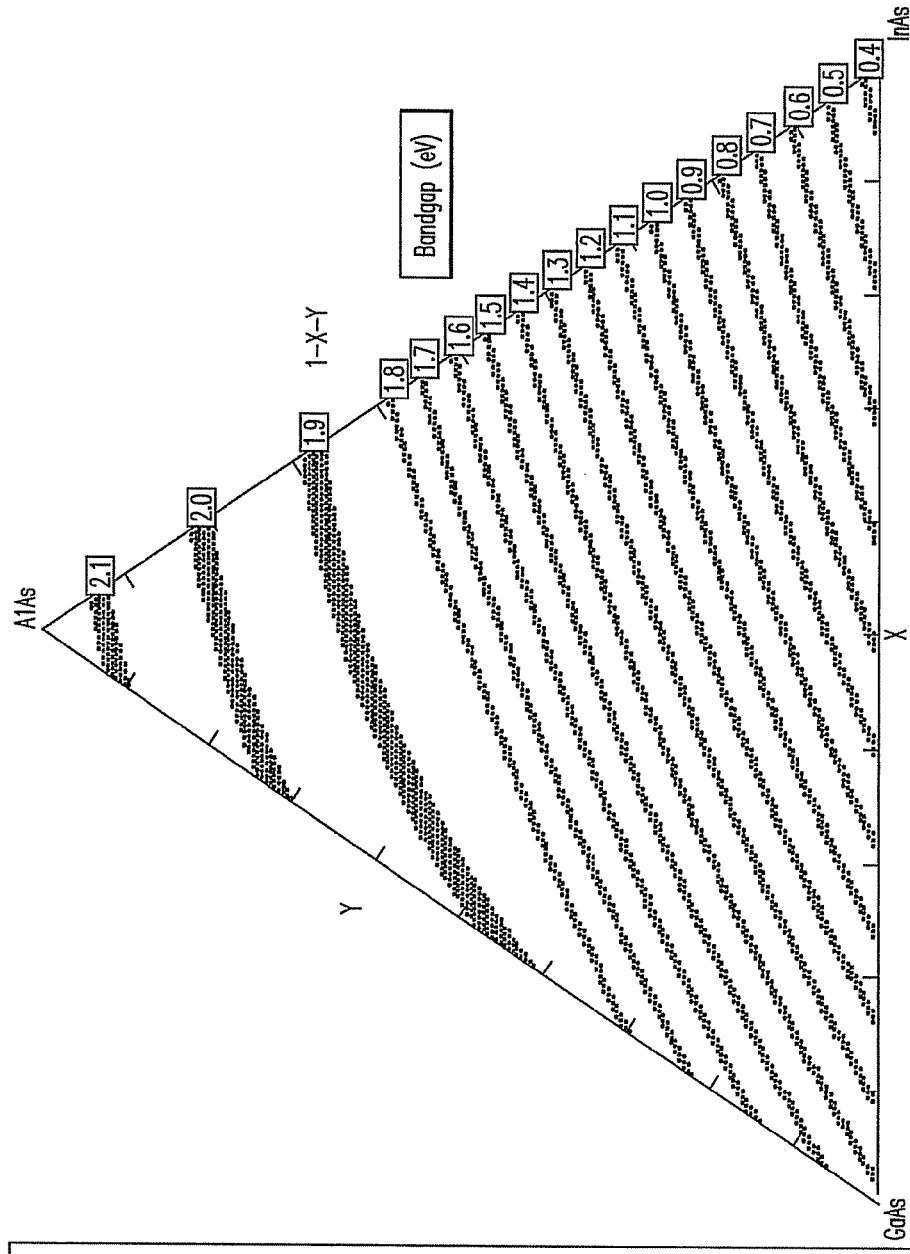
FIG. 18 is a diagram representing the relative concentration of Al, In, and Ga in an AlGaInAs material system needed to have a constant band gap with various designated values (ranging from 0.4 eV to 2.1 eV) as represented by curves on the diagram.
Figure 19:
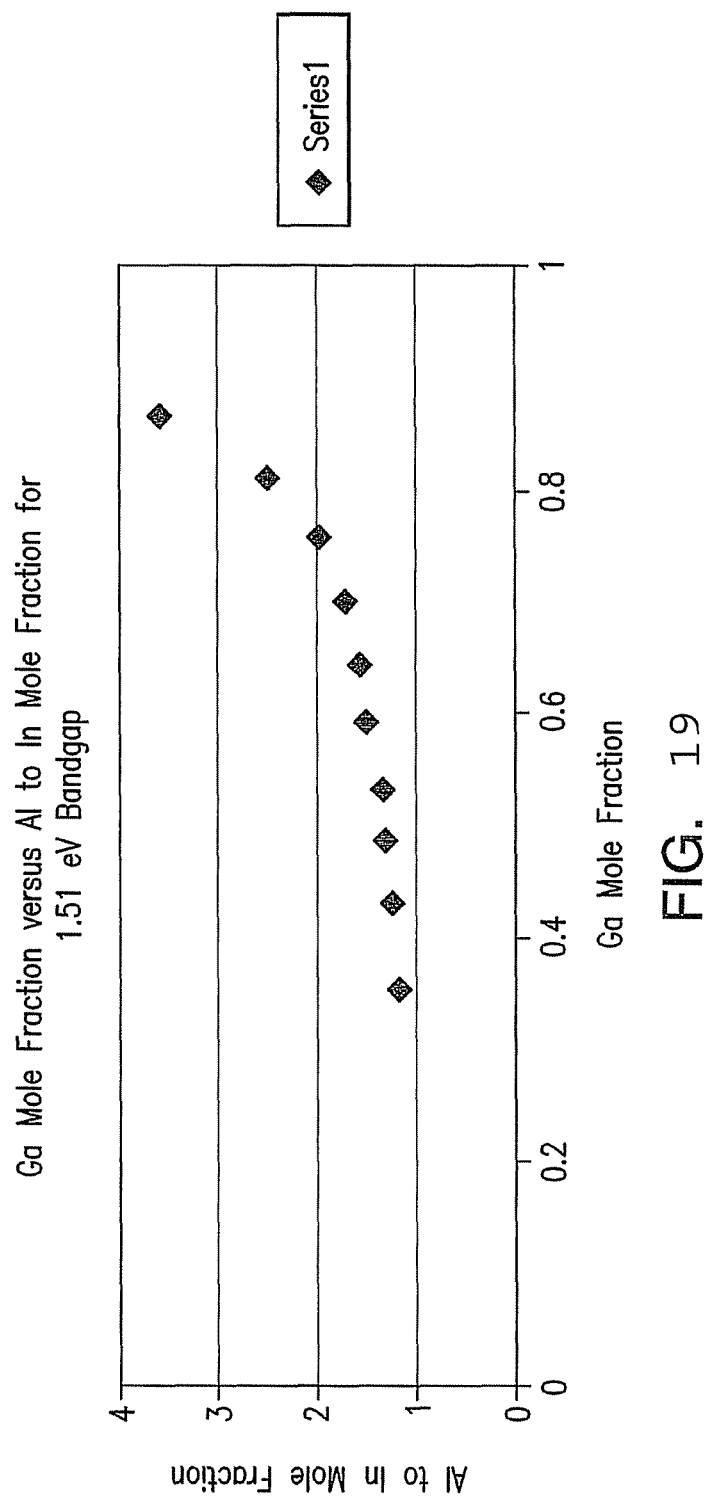
FIG. 19 is a graph representing the Ga mole fraction to the Al to In mole fraction in a AlGaInAs material system that is necessary to achieve a constant 1.51 eV band gap.

The fabrication of a step graded (or continuous graded) interlayer in an MOCVD process can be more explicitly described in a sequence of conceptual and operational steps which we describe here for pedagogical clarity. First, the appropriate band gap for the interlayer must be selected. In one of the disclosed embodiments, the desired constant band gap is 1.5 eV. Second, the most appropriate material system (i.e., the specific semiconductor elements to form a compound semiconductor alloy) must be identified. In the disclosed embodiment, these elements are Al, Ga, In, and As. Third, a computation must be made, for example using a computer program, to identify the class of compounds of $Al_y(Ga_xIn_{1-x})_{1-y}As$ for specific x and y that have a band gap of 1.5 eV. An example of such a computer program output that provides a very rough indication of these compounds is illustrated in FIG. 19. Fourth, based upon the lattice constants of the epitaxial layers adjoining the graded interlayer, a specification of the required lattice constants for the top surface of the interlayer (to match the adjacent semiconductor layer), and the bottom surface of the interlayer (to match the adjacent semiconductor layer) must be made. Fifth, based on the required lattice constants, the compounds of $Al_y(Ga_xIn_{1-x})_{1-y}As$ for specific x and y that have a band gap of 1.5 eV may be identified. Again, a computation must be made, and as an example, the data may be displayed in a graph such as FIG. 18 representing the Al, Ga and In mole fractions versus the Al to In mole fraction in a AlGaInAs material system that is necessary to achieve a constant 1.5 eV band gap. Assuming there is a small number (e.g. typically in the range of seven, eight, nine, ten, etc.) of steps or grades between the top surface and the bottom surface, and that the lattice constant difference between each step is made equal, the bold markings in FIG. 18 represent selected lattice constants for each successive sublayer in the interlayer, and the corresponding mole fraction of Al, Ga and In needed to achieve that lattice constant in that respective sublayer may be readily obtained by reference to the axes of the graph. Thus, based on an analysis of the data in FIG. 18, the reactor may be programmed to introduce the appropriate quantities of precursor gases (as determined by flow rates at certain timed intervals) into the reactor so as to achieve a desired specific $Al_y(Ga_xIn_{1-x})_{1-y}As$ composition in that sublayer so that each successive sublayer maintains the constant band gap of 1.5 eV and a monotonically increasing lattice constant. The execution of this sequence of steps, with calculated and determinate precursor gas composition, flow rate, temperature, and reactor time to achieve the growth of a $Al_y(Ga_xIn_{1-x})_{1-y}As$ composition of the interlayer with the desired properties (lattice constant change over thickness, constant band gap over the entire thickness), in a repeatable, manufacturable process, is not to be minimalized or trivialized.

Although one embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Other embodiments of the present disclosure may utilize continuously graded, as opposed to step graded, materials. More generally, the graded interlayer may be composed of any of the As, N, Sb based III-V compound semiconductors subject to the constraints of having the in-plane lattice parameter greater or equal to that of the second solar cell and less than or equal to that of the third solar cell, and having a bandgap energy greater than that of the second solar cell.

In another embodiment of the present invention, an optional second bather layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second bather layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n-emitter layer 119, and the p-type base layer 120. These layers are preferably composed of n type InGaAs and p type InGaAs respectively, or n type InGaP and p type InGaAs for a heterojunction subcell, although another suitable materials consistent with lattice constant and bandgap requirements may be used as well. The doping profile of layers 119 and 120 will be discussed in connection with FIG. 16.

A BSF layer 121, preferably composed of GaInP, is then deposited on top of the cell C, the BSF layer performing the same function as the BSF layers 108 and 113.

Finally a p++ contact layer 122 composed of GaInAs is deposited on the BSF layer 121.

It should be apparent to one skilled in the art, that additional layer(s) may be added or deleted in the cell structure without departing from the scope of the present invention.

Figure 3:
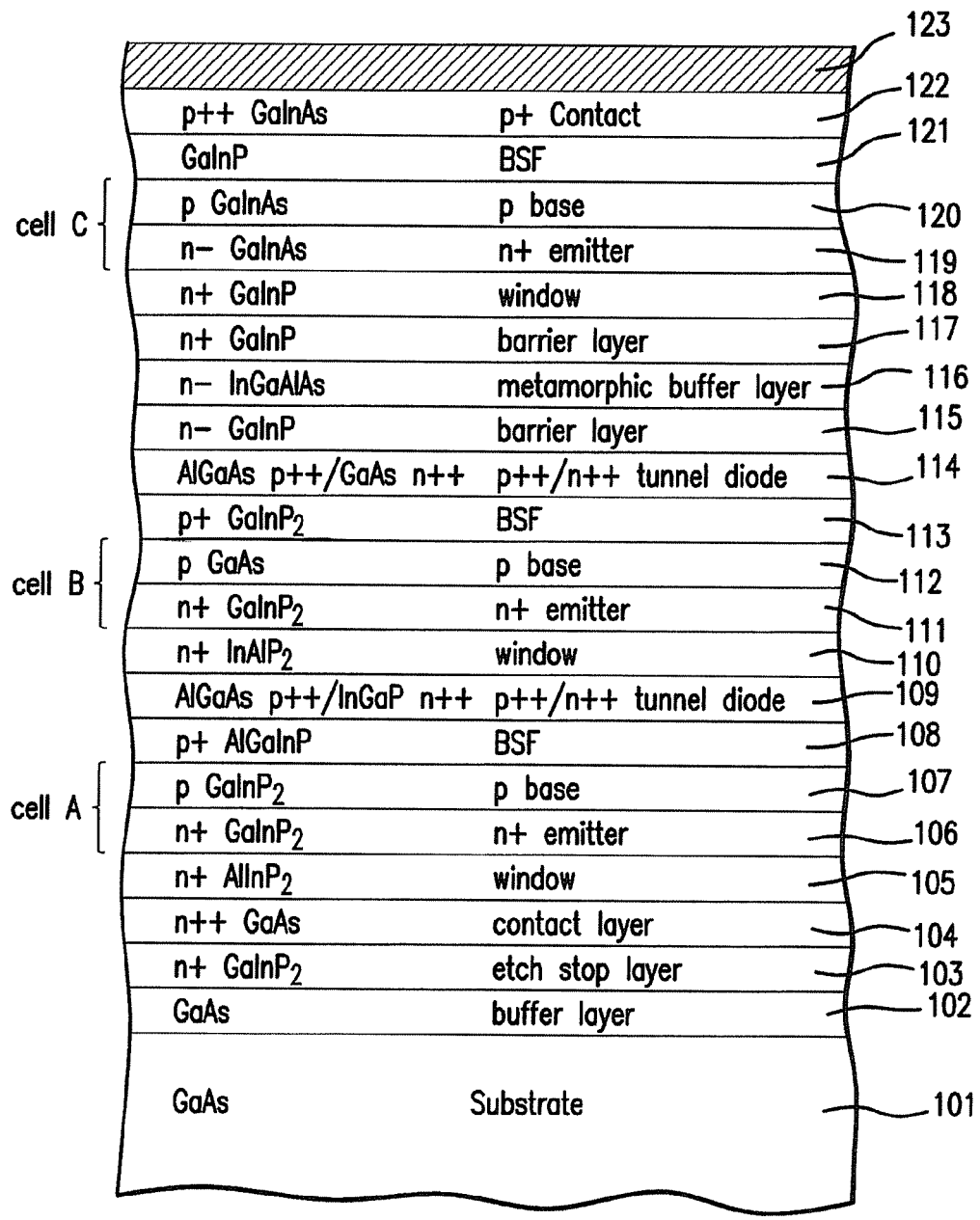
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+ semiconductor contact layer 122. The metal is preferably the sequence of metal layers Ti/Au/Ag/Au.

Figure 4:
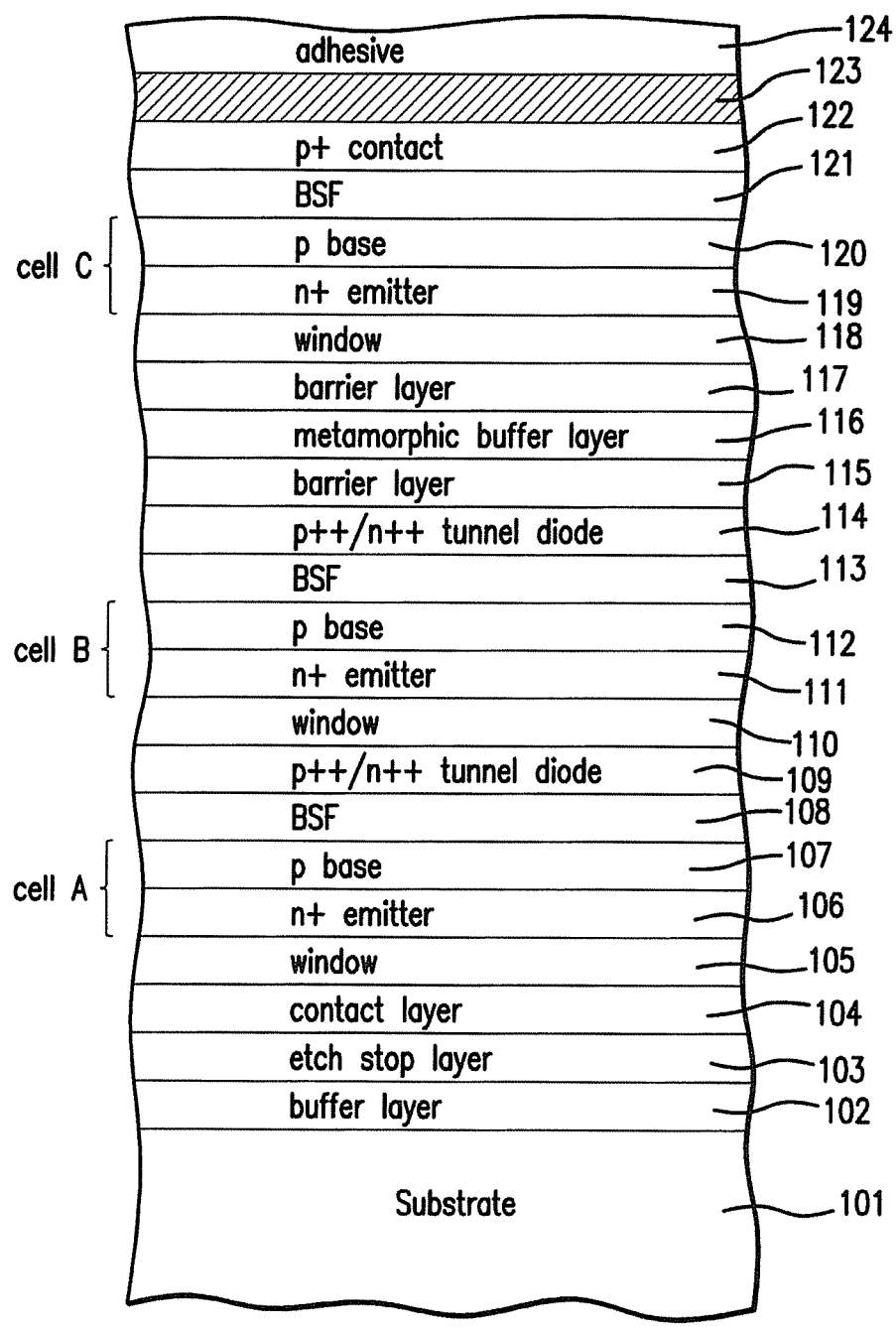
FIG. 4 is a cross-sectional view of the solar cell of FIG. 3 after next process step.

FIG. 4 is a cross-sectional view of the solar cell of FIG. 3 after the next process step in which an adhesive layer 124 is deposited over the metal layer 123. The adhesive is preferably Wafer Bond (manufactured by Brewer Science, Inc. of Rolla, Mo.).

Figure 5A:
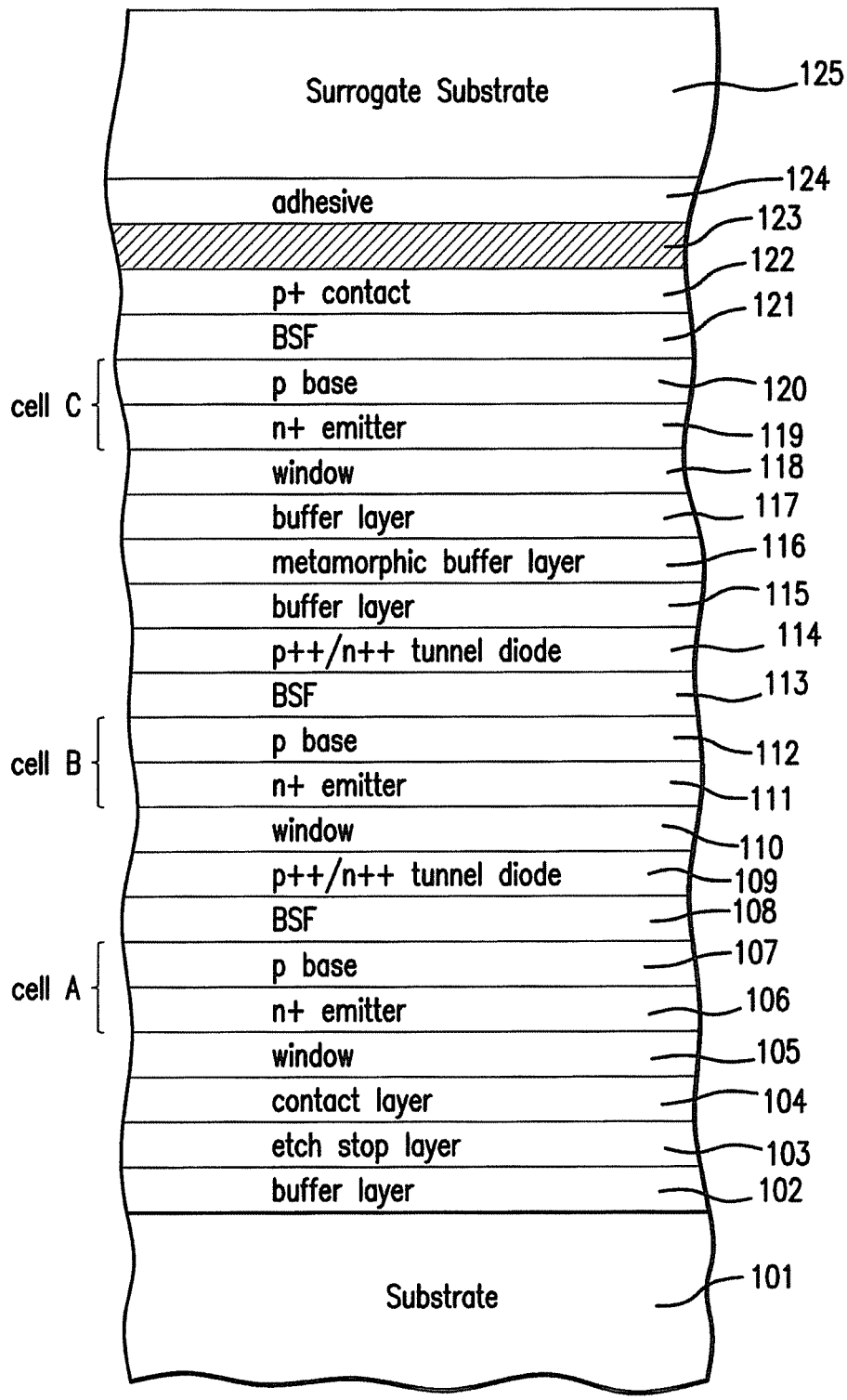
FIG. 5A is a cross-sectional view of the solar cell of FIG. 4 after the next process step in which a surrogate substrate is attached.

FIG. 5A is a cross-sectional view of the solar cell of FIG. 4 after the next process step in which a surrogate substrate 125, preferably sapphire, is attached. Alternative, the surrogate substrate may be GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. As an alternative to using an adhesive layer 124, a suitable substrate (e.g., GaAs) may be eutectically bonded to the metal layer 123.

Figure 5B:
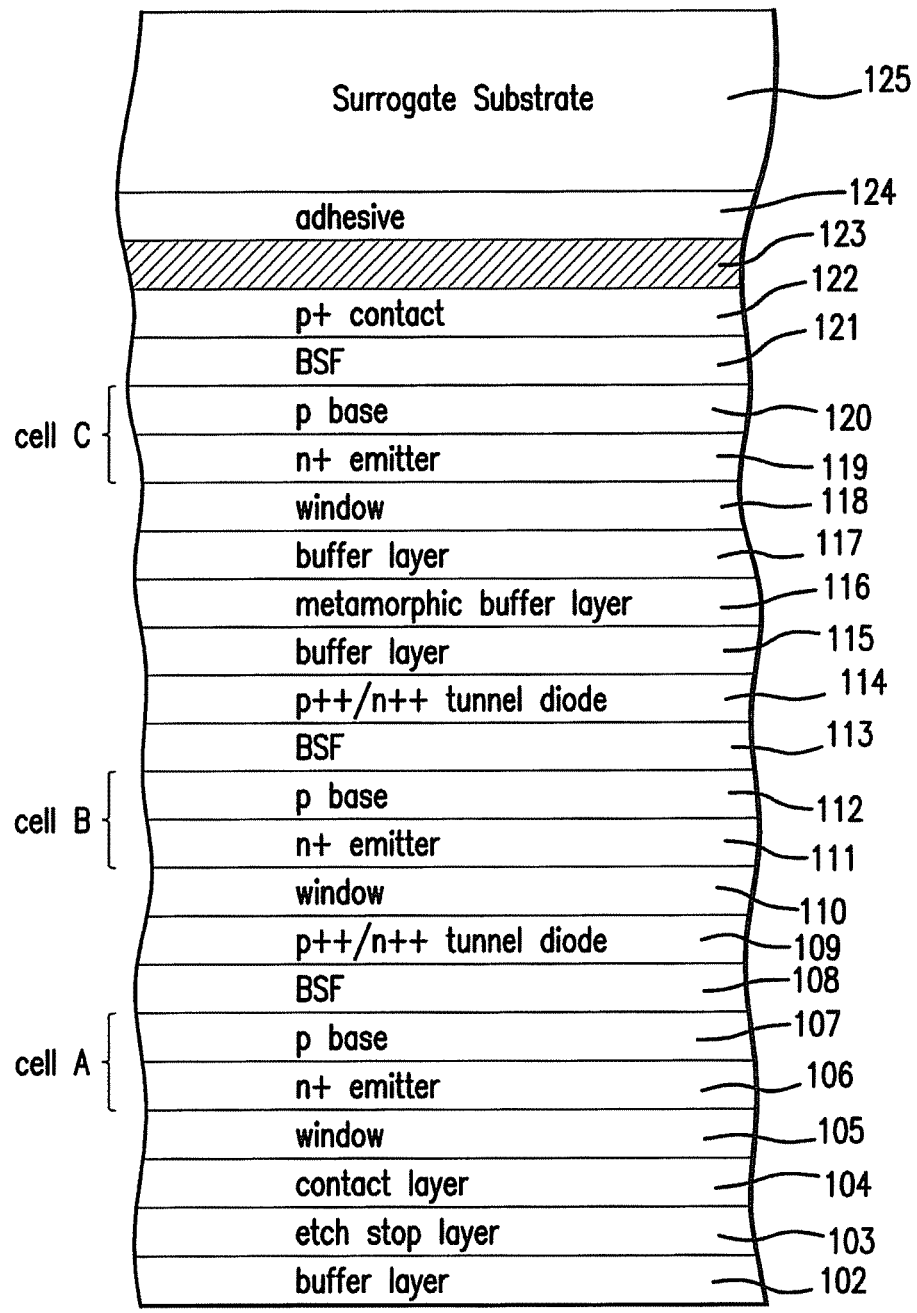
FIG. 5B is a cross-sectional view of the solar cell of FIG. 5A after the next process step in which the original substrate is removed.

FIG. 5B is a cross-sectional view of the solar cell of FIG. 5A after the next process step in which the original substrate is removed by a sequence of lapping and/or etching steps in which the substrate 101, the buffer layer 103, and the etch stop layer 103, are removed. The choice of a particular etchant is growth substrate dependent.

Figure 5C:
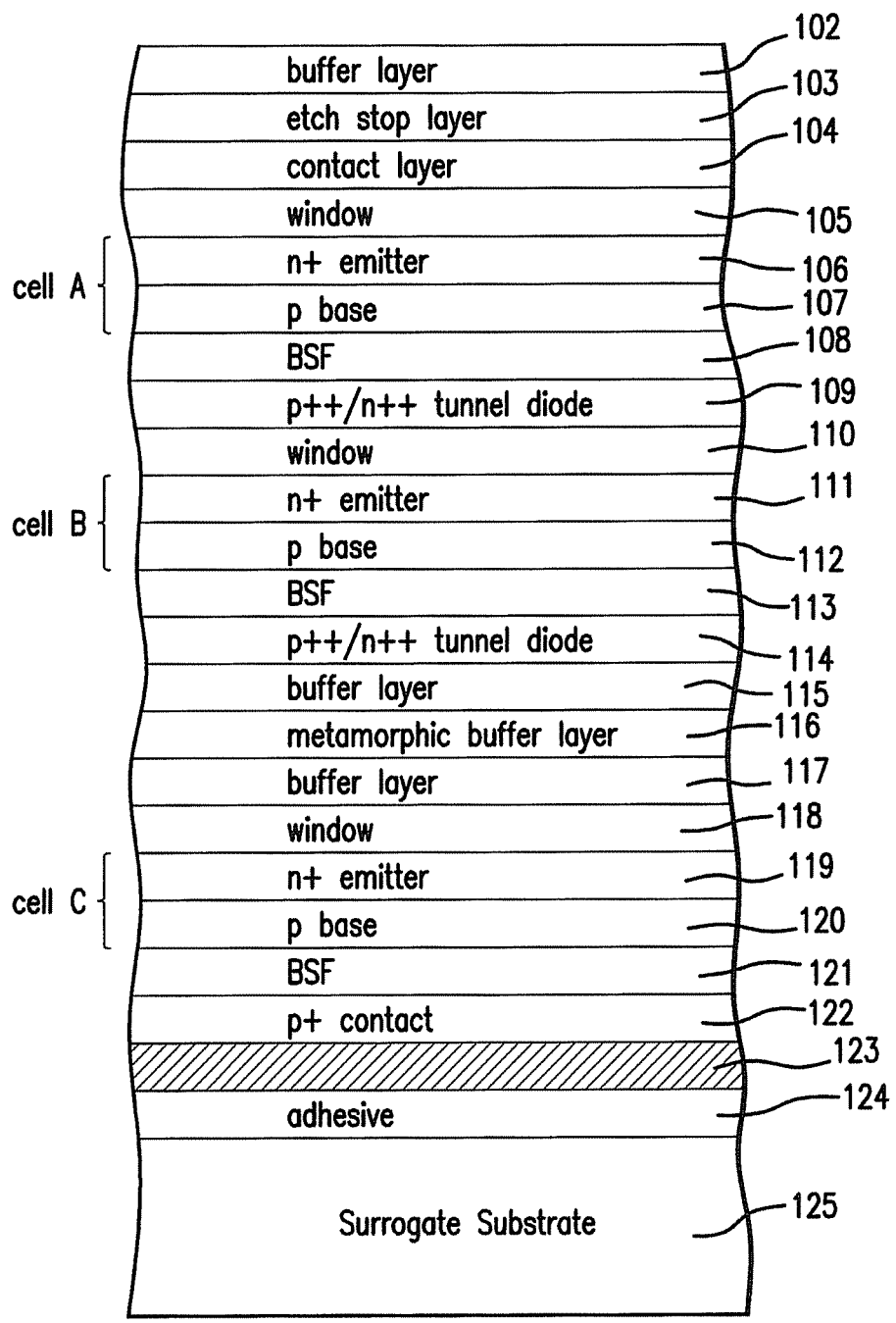
FIG. 5C is another cross-sectional view of the solar cell of FIG. 5B with the surrogate substrate on the bottom of the Figure.

FIG. 5C is a cross-sectional view of the solar cell of FIG. 5B with the orientation with the surrogate substrate 125 being at the bottom of the Figure. Subsequent Figures in this application will assume such orientation.

Figure 6:
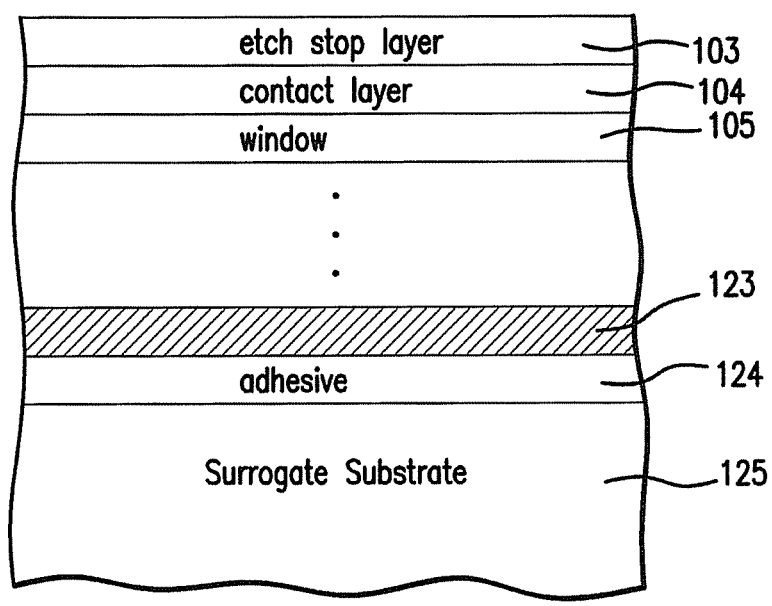
FIG. 6 is a simplified cross-sectional view of the solar cell of FIG. 5C after the next process step.

FIG. 6 is a simplified cross-sectional view of the solar cell of FIG. 5B depicting just a few of the top layers and lower layers over the surrogate substrate 125.

Figure 7:
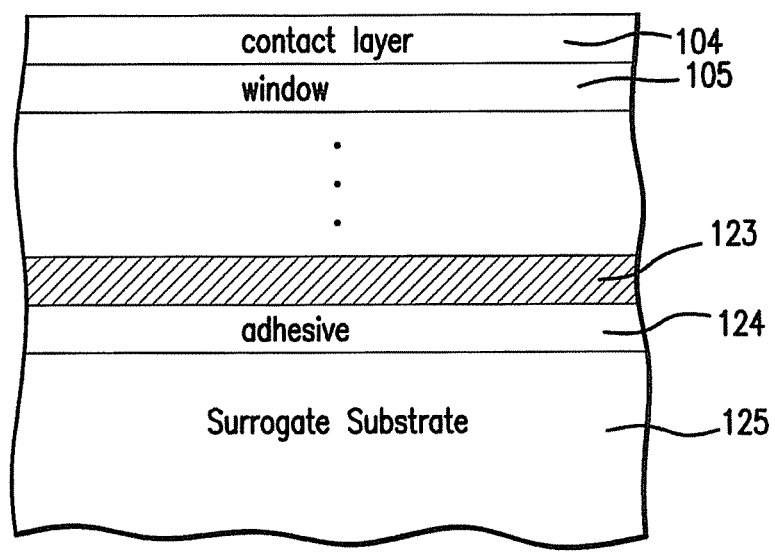
FIG. 7 is a cross-sectional view of the solar cell of FIG. 6 after the next process step.

FIG. 7 is a cross-sectional view of the solar cell of FIG. 6 after the next process step in which the etch stop layer 103 is removed by a HCl/H$_2$O solution.

Figure 8:
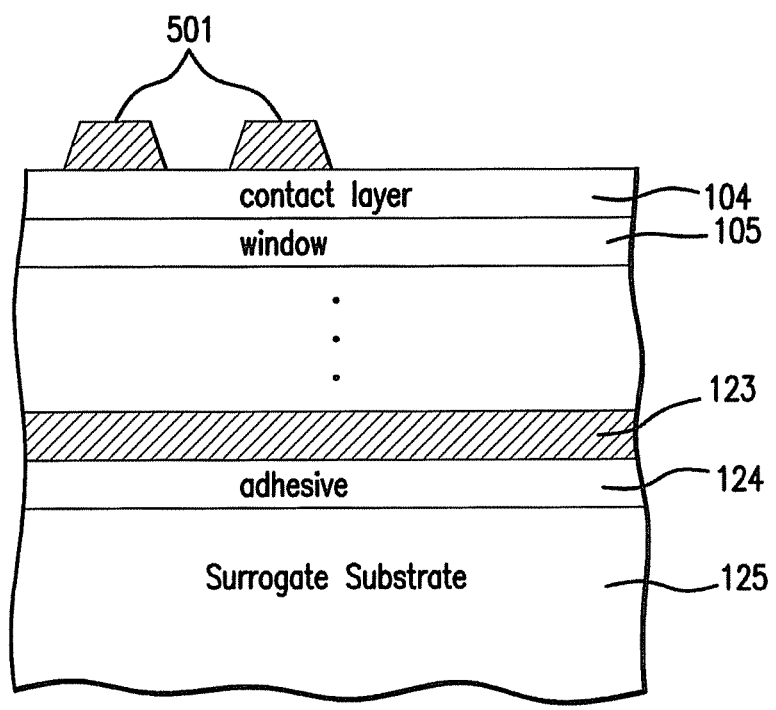
FIG. 8 is a cross-sectional view of the solar cell of FIG. 7 after the next process step.

FIG. 8 is a cross-sectional view of the solar cell of FIG. 7 after the next sequence of process steps in which a photoresist mask (not shown) is placed over the contact layer 104 to form the grid lines 501. The grid lines 501 are deposited via evaporation and lithographically patterned and deposited over the contact layer 104. The mask is lifted off to form the metal grid lines 501.

Figure 9:
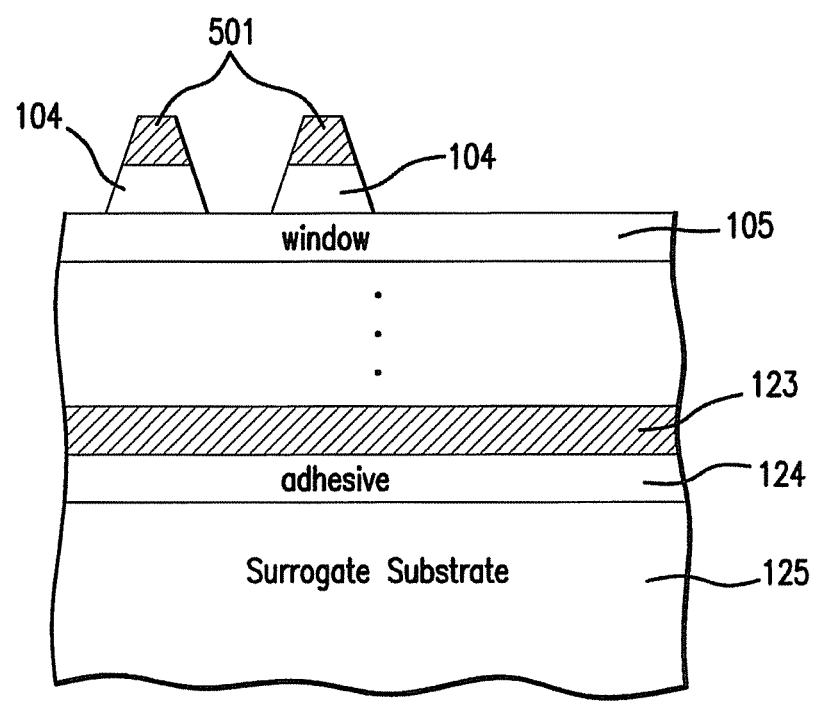
FIG. 9 is a cross-sectional view of the solar cell of FIG. 8 after the next process step.

FIG. 9 is a cross-sectional view of the solar cell of FIG. 8 after the next process step in which the grid lines are used as a mask to etch down the surface to the window layer 105 using a citric acid/peroxide etching mixture.

Figure 10A:
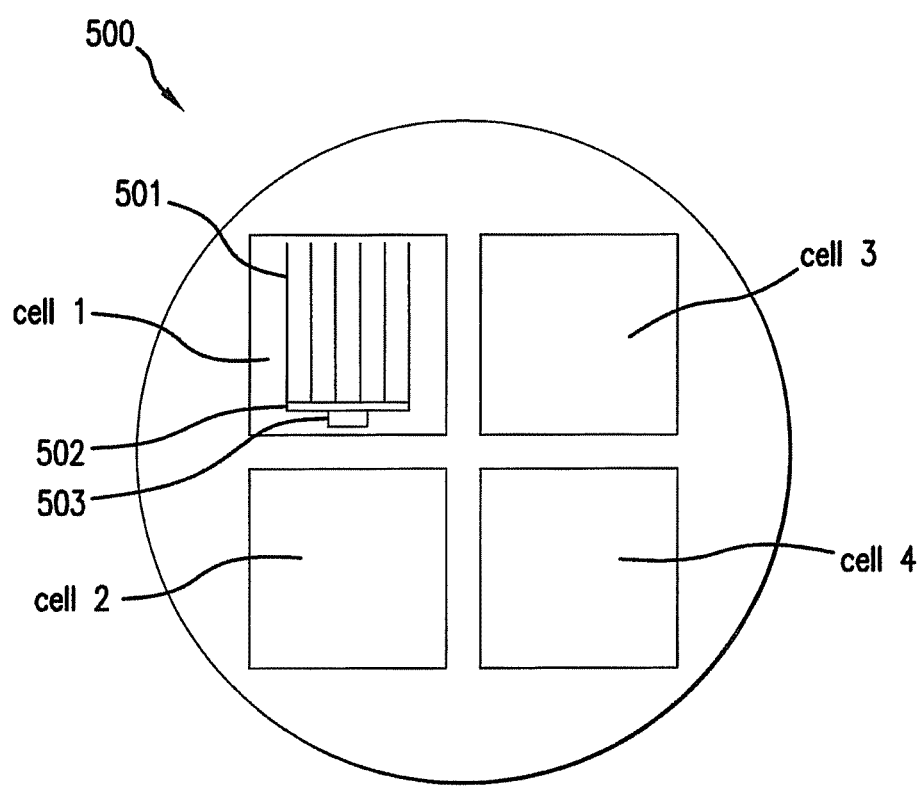
FIG. 10A is a top plan view of a wafer in which the solar cells are fabricated.

FIG. 10A is a top plan view of a wafer in which four solar cells are implemented. The depiction of four cells is for illustration for purposes only, and the present invention is not limited to any specific number of cells per wafer.

In each cell there are grid lines 501 (more particularly shown in cross-section in FIG. 9), an interconnecting bus line 502, and a contact pad 503. The geometry and number of grid and bus lines is illustrative and the present invention is not limited to the illustrated embodiment.

Figure 10B:
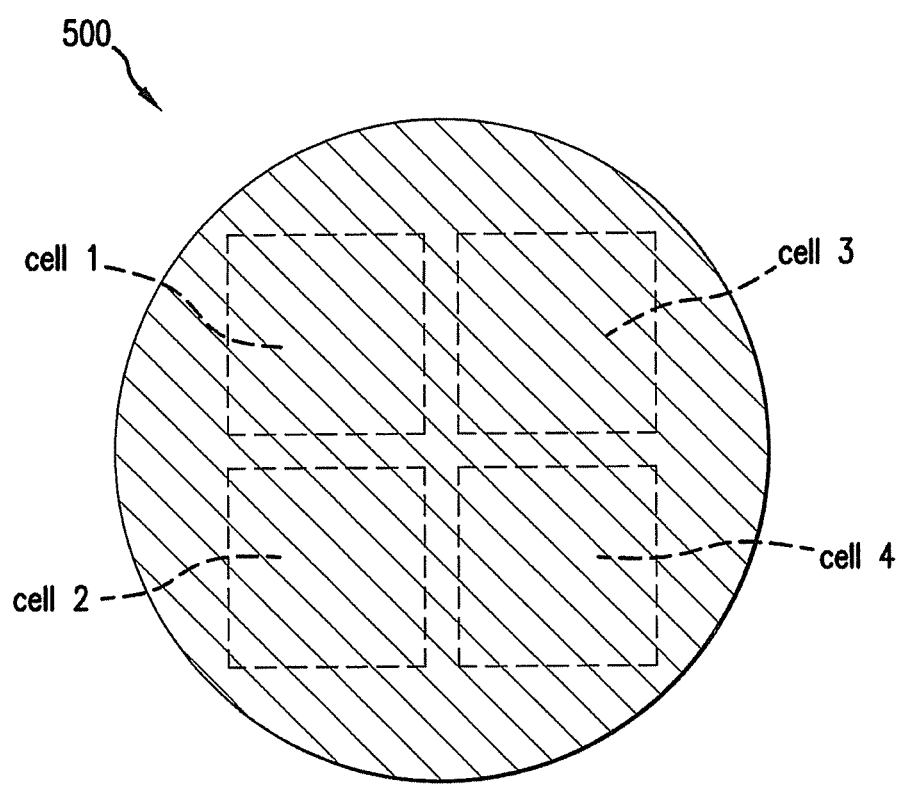
FIG. 10B is a bottom plan view of a wafer in which the solar cells are fabricated.

FIG. 10B is a bottom plan view of the wafer with four solar cells shown in FIG. 10A.

Figure 11:
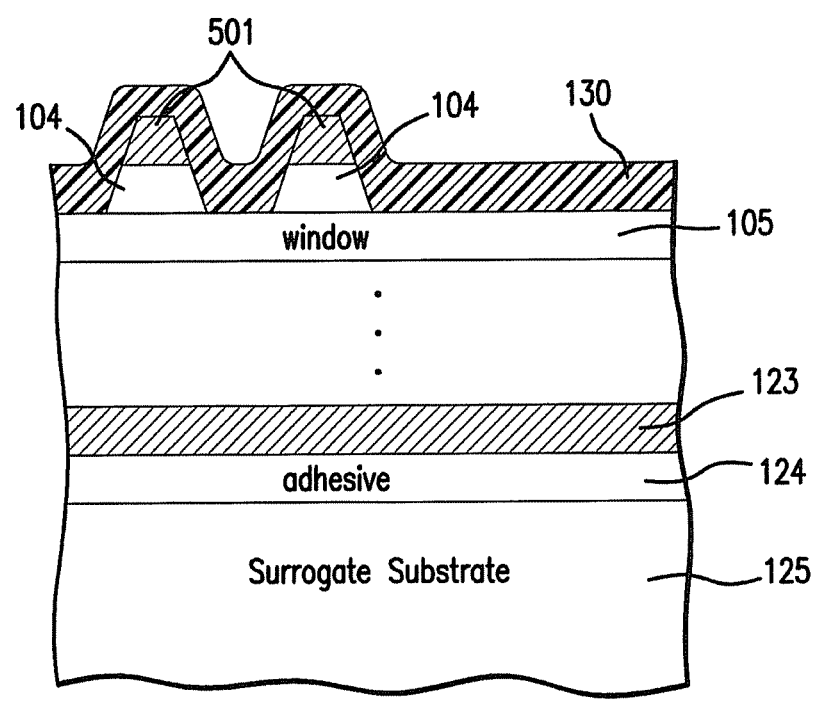
FIG. 11 is a cross-sectional view of the solar cell of FIG. 9 after the next process step.

FIG. 11 is a cross-sectional view of the solar cell of FIG. 11 after the next process step in which an antireflective (ARC) dielectric coating layer 130 is applied over the entire surface of the "bottom" side of the wafer with the grid lines 501.

Figure 12:
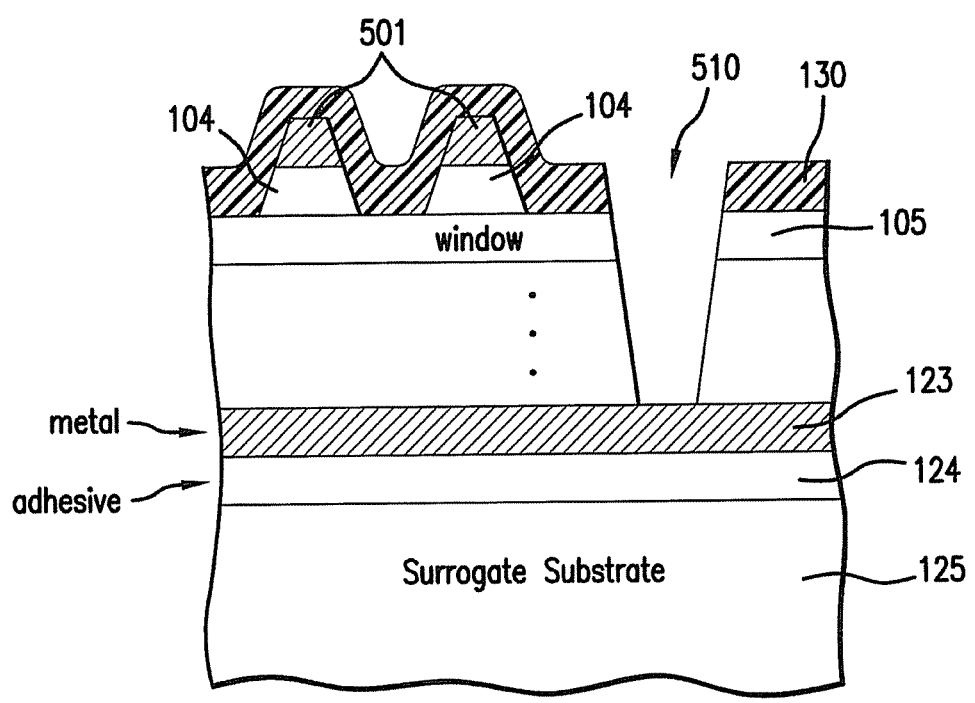
FIG. 12 is a cross-sectional view of the solar cell of FIG. 11 after the next process step.

FIG. 12 is a cross-sectional view of the solar cell of FIG. 11 after the next process step according to the present invention in which a channel 510 or portion of the semiconductor structure is etched down to the metal layer 123 using phosphide and arsenide etchants defining a peripheral boundary and leaving a mesa structure which constitutes the solar cell. The cross-section depicted in FIG. 12 is that as seen from the A-A plane shown in FIG. 13.

Figure 13:
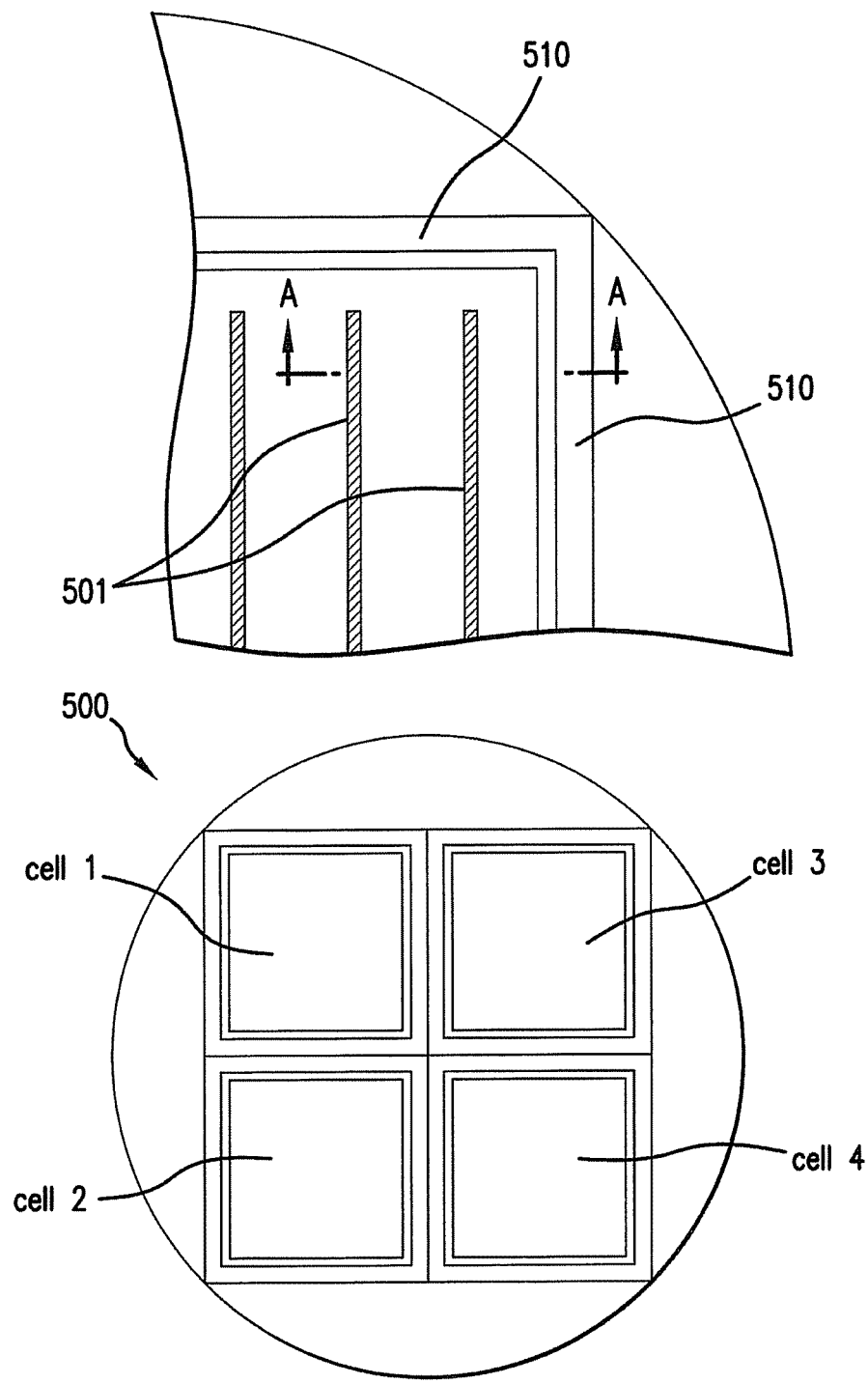
FIG. 13 is a top plan view of the wafer of FIG. 12 after the next process step in which a trench is etched around the cell.

FIG. 13 is a top plan view of the wafer of FIG. 12 depicting the channel 510 etched around the periphery of each cell using phosphide and arsenide etchants.

Figure 14A:
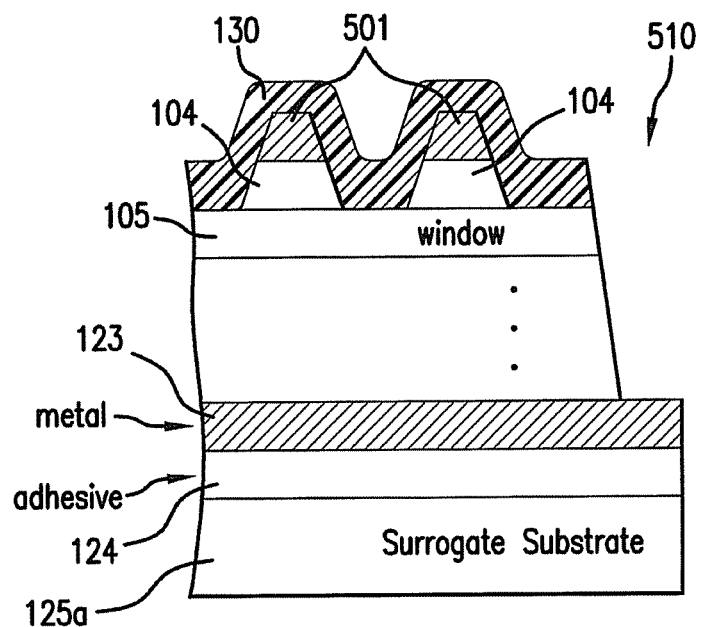
FIG. 14A is a cross-sectional view of the solar cell of FIG. 12 after the next process step in a first embodiment of the present invention.

FIG. 14A is a cross-sectional view of the solar cell of FIG. 12 after the next process step in a first embodiment of the present invention in which the surrogate substrate 125 is appropriately thinned to a relatively thin layer 125a, by grinding, lapping, or etching.

Figure 14B:
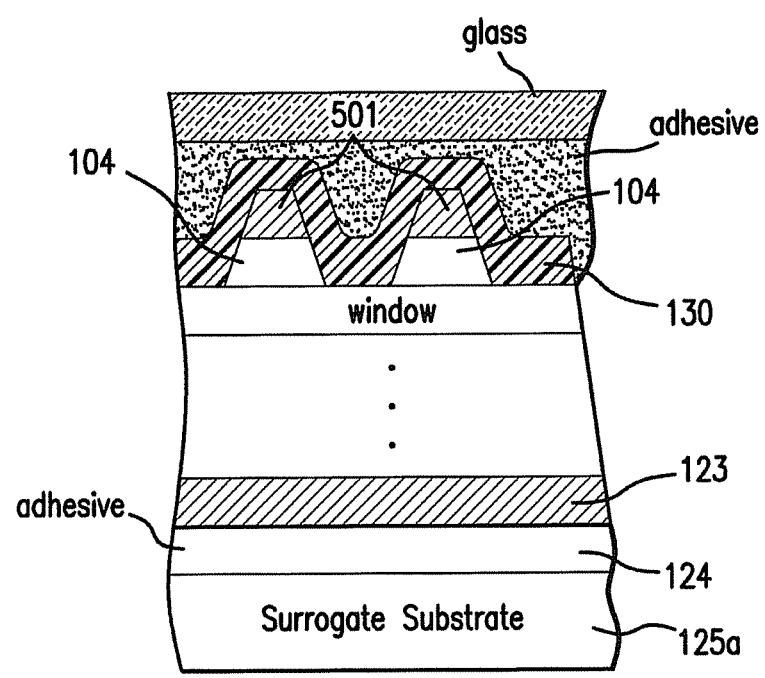
FIG. 14B is a cross-sectional view of the solar cell of FIG. 14A after the next process step in a second embodiment of the present invention.

FIG. 14B is a cross-sectional view of the solar cell of FIG. 14A after the next process step in a second embodiment of the present invention in which a cover glass is secured to the top of the cell by an adhesive.

Figure 15:
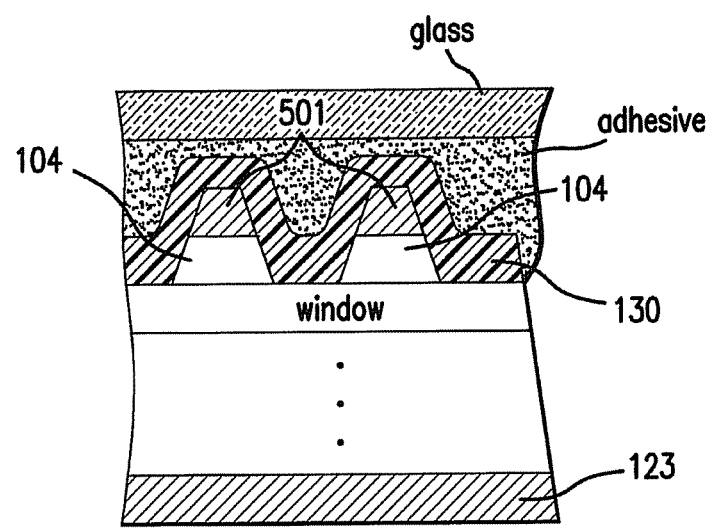
FIG. 15 is a cross-sectional view of the solar cell of FIG. 14B after the next process step in a third embodiment of the present invention.

FIG. 15 is a cross-sectional view of the solar cell of FIG. 14B after the next process step in a third embodiment of the present invention in which a cover glass is secured to the top of the cell and the surrogate substrate 125 is entirely removed, leaving only the metal contact layer 123 which forms the backside contact of the solar cell. The surrogate substrate may be reused in subsequent wafer processing operations.

Figure 16:
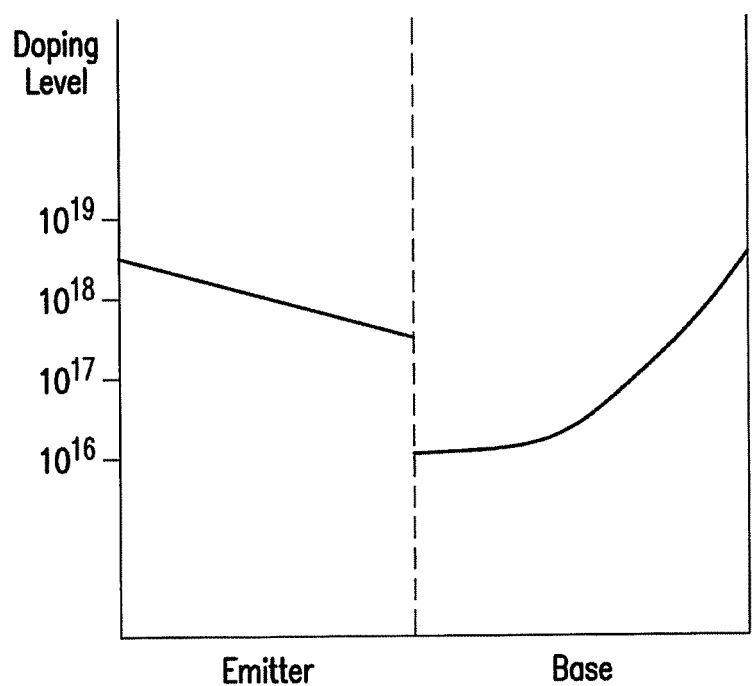
FIG. 16 is a graph of the doping profile in a base layer in the metamorphic solar cell according to the present invention.

FIG. 16 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

Figure 17:
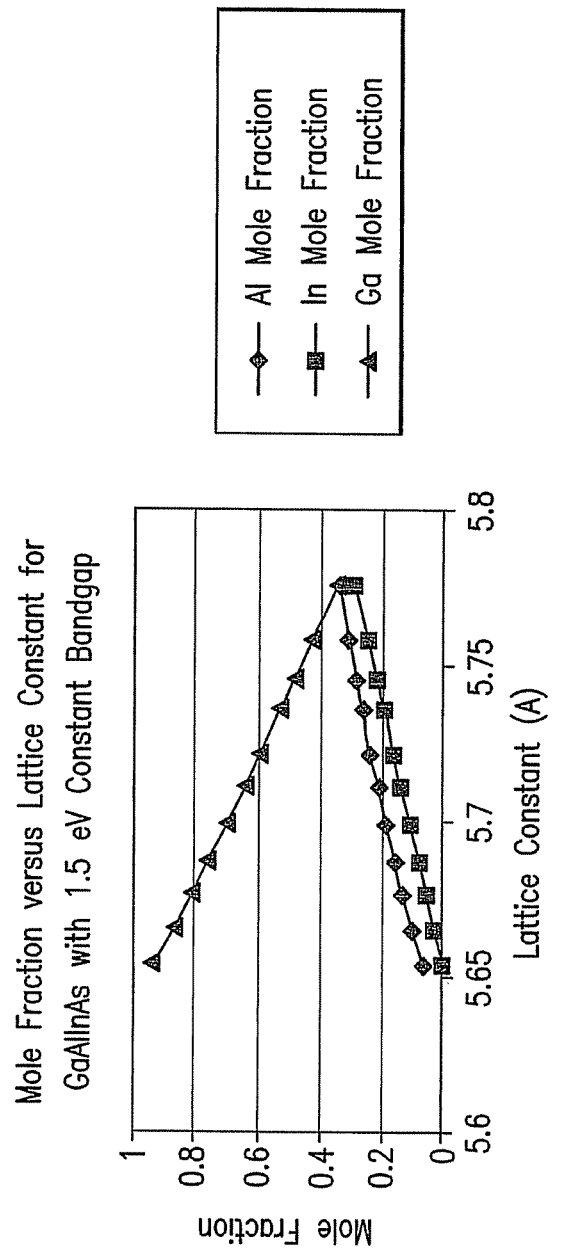
FIG. 17 is a graph representing the Al, Ga and In mole fractions versus the Al to In mole fraction in a AlGaInAs material system that is necessary to achieve a constant 1.5 eV band gap.

FIG. 17 is a graph representing the Al, Ga and In mole fractions versus the Al to In mole fraction in a AlGaInAs material system that is necessary to achieve a constant 1.5 eV band gap.

FIG. 18 is a diagram representing the relative concentration of Al, In, and Ga in an AlGaInAs material system needed to have a constant band gap with various designated values (ranging from 0.4 eV to 2.1 eV) as represented by curves on the diagram. The range of band gaps of various GaInAlAs materials is represented as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

FIG. 19 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.51 eV band gap.

It will be understood that each of the elements described above, or two or more together, also may find a useful application in other types of constructions differing from the types of constructions described above.

Although the preferred embodiment of the present invention utilizes a vertical stack of three subcells, the present invention can apply to stacks with fewer or greater number of subcells, i.e. two junction cells, four junction cells, five junction cells, etc. In the case of four or more junction cells, the use of more than one metamorphic grading interlayer may also be utilized.

The structures and methods according to the present invention can be applied to form cells with either p/n or n/p configurations, or both, with suitable choice of the conductivity type of the growth substrate. If the growth substrate has the opposite conductivity type from that needed for the configuration of the p and n layer sequence in the cell, appropriate tunnel diodes can be used throughout the cells as illustrated in the present invention.

In addition, although the preferred embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e. a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type and p-type regions, and/or different band gap energies in the p-type regions, in addition to utilizing different dopant species and type in the p-type and n-type regions that form the junction.

In some cells, a thin so-called "intrinsic layer" may be placed between the emitter layer and base layer, with the same or different composition from either the emitter base layer. The intrinsic layer functions to suppress minority-carrier recombination in the space-charge region. Similarly, either the base layer or, the emitter layer may also be intrinsic or not-intentionally-doped ("ND") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in a inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as thermophotovoltaic (TPV) cells, photodetectors and lightemitting diodes (LEDs) are very similar in structure, physics, and materials to photovoltaic devices with only some minor variations in doping and the like. For example, photodetectors can be fabricated from similar III-V materials and structures as the photovoltaic devices described above, but perhaps more lightly-doped regions for light sensitivity rather than maximizing power production. Similarly, LEDs can also be made with similar structures and materials, but perhaps more heavily-doped regions to shorten recombination time, thus radiative lifetime to produce light instead of power. Therefore, this invention also applies to photodetectors and LEDs with similar structures, materials, and compositions of matter, the related articles of manufacture and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspect of this invention and, therefore, such adaptations should and are intended to be comprehended within the meaning and range of equivalence of the following claims.

What is claimed is:

1. A method of forming a multijunction solar cell comprising:
    forming a bottom subcell having a bandgap in the range of 0.8 to 1.2 eV;
    forming a heterojunction middle subcell having a base and emitter, a bandgap greater than the bandgap of the bottom subcell and less than 1.50 eV, and being disposed over and being lattice mismatched to the bottom subcell;
    forming a continuously-graded interlayer composed of InGaAlAs and having a bandgap that remains constant at about 1.50 eV between the middle and bottom subcells by identifying a set of compositions of the formula $(In_xGa_{1-x})_yAl_{1-y}As$ defined by specific values of x and y, wherein $0<x<1$ and $0<y<1$, each composition having a bandgap of 1.50 eV; identifying a lattice constant for one side of the graded interlayer that matches the middle subcell and a lattice constant for an opposing side of the interlayer that matches the bottom subcell; and identifying a subset of compositions of the formula $(In_xGa_{1-x})_yAl_{1-y}As$ having bandgaps of 1.5 eV that are defined by specific values of x and y, wherein $0<x<1$ and $0<y<1$, wherein the subset of compositions have lattice constants ranging from the identified lattice constant that matches the middle subcell to the identified lattice constant that matches the bottom subcell; and
    forming a homojunction top subcell having a base and emitter and being disposed over and being lattice matched to the middle subcell,
    wherein said graded interlayer is compositionally graded to lattice match the middle subcell at one side and the bottom subcell at an opposing side,
    wherein forming the graded interlayer further comprises: providing a metal organic chemical vapor deposition (MOCVD) system configured to independently control the flow of source gases for gallium, indium, aluminum, and arsenic; selecting a reaction time and temperature and a flow rate for each source gas to form the continuously-graded interlayer disposed on the bottom subcell, wherein the source gas for indium is trimethylindium (InMe3), the source gas for gallium is trimethylgallium (GaMe3), the source gas for arsenic is arsine (ASH3), and the source gas for aluminum in trimethylaluminium (Al2Me6).

2. A method according to claim 1 wherein identifying the set of compositions of the formula $(In_xGa_{1-x})_yAl_{1-y}As$ defined by specific values of x and y, wherein $0<x<1$ and $0<y<1$, each composition having a bandgap of 1.50 eV comprises identifying using a computer program.

3. A method according to claim 1 wherein identifying a subset of compositions of the formula $(In_xGa_{1-x})_yAl_{1-y}As$ having bandgaps of 1.5 eV that are defined by specific values of x and y, wherein $0<x<1$ and $0<y<1$, wherein the subset of compositions have lattice constants ranging from the identified lattice constant that matches the middle subcell to the identified lattice constant that matches the bottom subcell comprises identifying using a computer program.

4. A method according to claim 1 further comprising precisely controlling and incrementally adjusting the mole fraction of each of In, Ga, and Al to form the continuously-graded interlayer.

5. A method of forming a multijunction solar cell comprising:
    forming a heterojunction bottom subcell having a base and emitter and having a bandgap in the range of 0.8 to 1.2 eV, wherein the bandgap of the base of the bottom subcell is narrower than the bandgap of the emitter of the bottom subcell;
    forming a heterojunction middle subcell having a base and emitter, a bandgap greater than the bandgap of the bottom subcell and less than 1.50 eV, and being disposed over and being lattice mismatched to the bottom subcell, wherein the bandgap of the base of the middle subcell is narrower than the bandgap of the emitter of the middle subcell;
    forming a step-graded interlayer comprising a plurality of sublayers composed of InGaAlAs and having a bandgap that remains constant at about 1.50 eV between the middle and bottom subcells by identifying a set of compositions of the formula $(In_xGa_{1-x})_yAl_{1-y}As$ defined by specific values of x and y, wherein $0<x<1$ and $0<y<1$, each composition having a bandgap of 1.50 eV; identifying a lattice constant for one side of the graded interlayer that matches the middle subcell and a lattice constant for an opposing side of the interlayer that matches the bottom subcell; identifying a subset of compositions of the formula $(In_xGa_{1-x})_yAl_{1-y}As$ having bandgaps of 1.5 eV that are defined by specific values of x and y, wherein $0<x<1$ and $0<y<1$, wherein the subset of compositions have lattice constants ranging from the identified lattice constant that matches the middle subcell to the identified lattice constant that matches the bottom subcell; and selecting a composition for each sublayer of the plurality of sublayers from the subset of compositions; and
    forming a homojunction top subcell having a base and emitter and being disposed over and being lattice matched to the middle subcell,
    wherein said graded interlayer is compositionally graded to lattice match the middle subcell at one side and the bottom subcell at an opposing side,
    wherein forming the graded interlayer further comprises: providing a metal organic chemical vapor deposition (MOCVD) system configured to independently control the flow of source gases for gallium, indium, aluminum, and arsenic; selecting a reaction time and temperature and a flow rate for each source gas to form each sublayer of the step-graded interlayer disposed on the bottom subcell, wherein the source gas for indium is trimethylindium (InMe3), the source gas for gallium is trimethylgallium (GaMe3), the source gas for arsenic is arsine (ASH3), and the source gas for aluminum in trimethylaluminium (Al2Me6).

6. A method according to claim 5 wherein identifying the set of compositions of the formula $(In_xGa_{1-x})_yAl_{1-y}As$ defined by specific values of x and y, wherein $0<x<1$ and $0<y<1$, each composition having a bandgap of 1.50 eV comprises identifying using a computer program.

7. A method according to claim 5 wherein identifying a subset of compositions of the formula $(In_xGa_{1-x})_yAl_{1-y}As$ having bandgaps of 1.5 eV that are defined by specific values of x and y, wherein $0<x<1$ and $0<y<1$, wherein the subset of compositions have lattice constants ranging from the identified lattice constant that matches the middle subcell to the identified lattice constant that matches the bottom subcell comprises identifying using a computer program.

8. A method according to claim 5 further comprising precisely controlling and step-wise adjusting the mole fraction of each of In, Ga, and Al to form the step-graded interlayer.

\* \* \* \* \*